(12) United States Patent
Minami et al.

(10) Patent No.: US 9,218,767 B2
(45) Date of Patent: Dec. 22, 2015

(54) DISPLAY DEVICE, METHOD OF LAYING OUT LIGHT EMITTING ELEMENTS, AND ELECTRONIC DEVICE

(71) Applicant: Sony Corporation, Tokyo (JP)

(72) Inventors: Tetsuo Minami, Tokyo (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/564,729

(22) Filed: Dec. 9, 2014

(65) Prior Publication Data

US 2015/0144929 A1    May 28, 2015

Related U.S. Application Data

(63) Continuation of application No. 13/763,745, filed on Feb. 11, 2013, now Pat. No. 8,963,139, which is a continuation of application No. 12/385,648, filed on Apr. 15, 2009.

(30) Foreign Application Priority Data

May 21, 2008 (JP) ................................ 2008-132854

(51) Int. Cl.
*H01L 27/32* (2006.01)
*G09G 3/32* (2006.01)

(52) U.S. Cl.
CPC ............ *G09G 3/3233* (2013.01); *G09G 3/3266* (2013.01); *H01L 27/326* (2013.01);
(Continued)

(58) Field of Classification Search
CPC .............. H01L 27/316; H01L 27/3265; H01L 37/3244

USPC ........................................................... 257/40
See application file for complete search history.

(56) References Cited

U.S. PATENT DOCUMENTS 6,088,011 A    7/2000    Lee et al.
8,118,633 B2   2/2012    Yuasa
(Continued)

FOREIGN PATENT DOCUMENTS

JP    62-208025 A    9/1987
JP    2005-345766 A    12/2005
(Continued)

OTHER PUBLICATIONS

Japanese Office Action issued Apr. 27, 2010 for corresponding Japanese Application No. 2008-132854.

*Primary Examiner* — Tran Tran
(74) *Attorney, Agent, or Firm* — Michael Best & Friedrich LLP

(57) ABSTRACT

Disclosed herein is a display device in which light emitting elements of a plurality of colors including a light emitting element emitting blue light are formed in each pixel on a substrate on which a transistor is formed for each sub-pixel, and a plurality of pixels formed with sub-pixels of the plurality of colors as a unit are arranged in a form of a matrix, wherein relative positional relation between transistors of sub-pixels of respective light emission colors including blue light and a light emitting section of a light emitting element emitting the blue light is laid out such that distances between the transistors of the sub-pixels of the respective light emission colors including the blue light and the light emitting section of the light emitting element emitting the blue light are equal to each other for the respective colors.

23 Claims, 18 Drawing Sheets

(52) U.S. Cl.
CPC ........ *H01L27/3211* (2013.01); *H01L 27/3216* (2013.01); *H01L 27/3244* (2013.01); *H01L 27/3262* (2013.01); *H01L 27/3265* (2013.01); *G09G 2300/0443* (2013.01); *G09G 2300/0452* (2013.01); *G09G 2300/0819* (2013.01); *G09G 2300/0842* (2013.01); *G09G 2300/0852* (2013.01); *G09G 2320/0233* (2013.01); *G09G 2320/043* (2013.01); *H01L 27/3213* (2013.01)

(56) References Cited

U.S. PATENT DOCUMENTS

| | | |
|---|---|---|
| 2002/0070909 A1 | 6/2002 | Asano et al. |
| 2003/0052597 A1 | 3/2003 | Sakurai |
| 2003/0090581 A1 | 5/2003 | Credelle et al. |
| 2004/0108818 A1 | 6/2004 | Cok et al. |
| 2004/0113875 A1 | 6/2004 | Miller et al. |
| 2004/0125278 A1 | 7/2004 | Park et al. |
| 2004/0178743 A1 | 9/2004 | Miller et al. |
| 2004/0178974 A1 | 9/2004 | Miller et al. |
| 2005/0001542 A1 | 1/2005 | Kiguchi |
| 2005/0087740 A1 | 4/2005 | Matsumoto et al. |
| 2005/0116615 A1 | 6/2005 | Matsumoto et al. |
| 2005/0162179 A1 | 7/2005 | Hosaka et al. |
| 2005/0212728 A1 | 9/2005 | Miller et al. |
| 2006/0087227 A1 | 4/2006 | Yamanaka |
| 2007/0001584 A1 | 1/2007 | Lee et al. |
| 2008/0079662 A1 | 4/2008 | Saishu et al. |
| 2009/0121983 A1 | 5/2009 | Sung et al. |
| 2009/0322215 A1 | 12/2009 | Sung et al. |
| 2011/0025669 A1* | 2/2011 | Kwak et al. ............... 345/211 |

FOREIGN PATENT DOCUMENTS

| | | |
|---|---|---|
| JP | 2005-352147 A | 12/2005 |
| JP | 2006-133542 | 5/2006 |
| WO | WO-2004/073356 A1 | 8/2004 |

\* cited by examiner

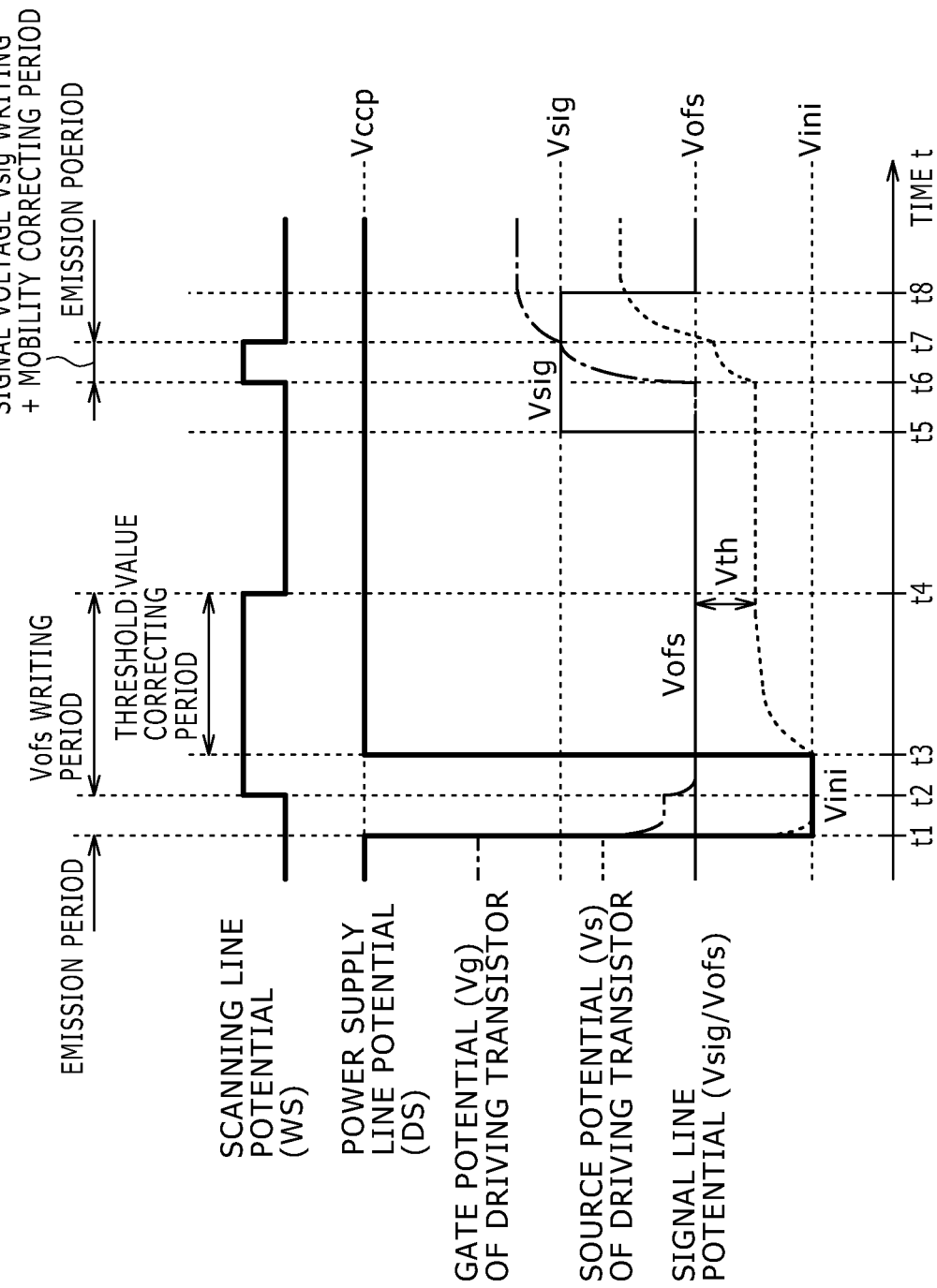

FIG. 8A  THRESHOLD VALUE CORRECTION: ABSENT, MOBILITY CORRECTION: ABSENT
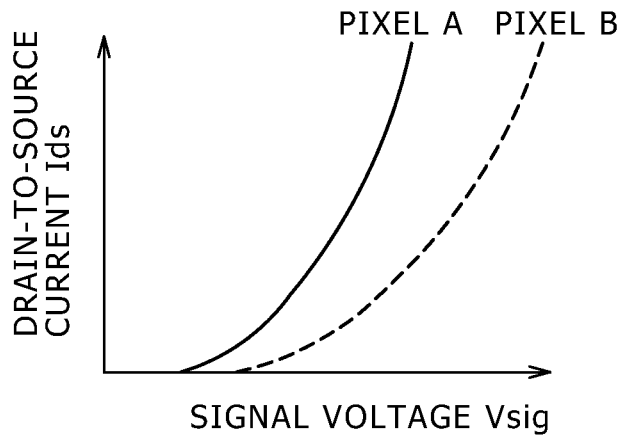
FIG. 8B  THRESHOLD VALUE CORRECTION: PRESENT, MOBILITY CORRECTION: ABSENT
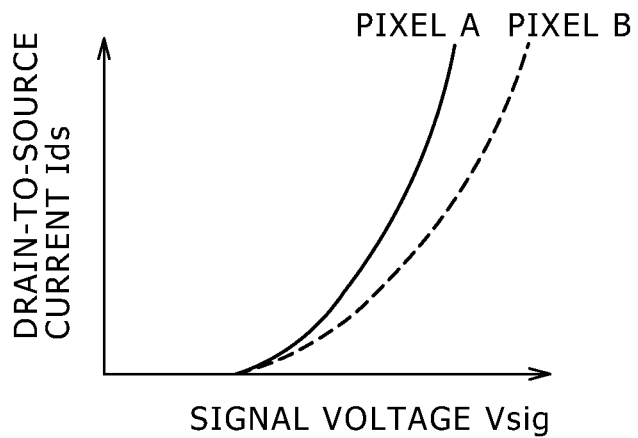
FIG. 8C  THRESHOLD VALUE CORRECTION: PRESENT, MOBILITY CORRECTION: PRESENT
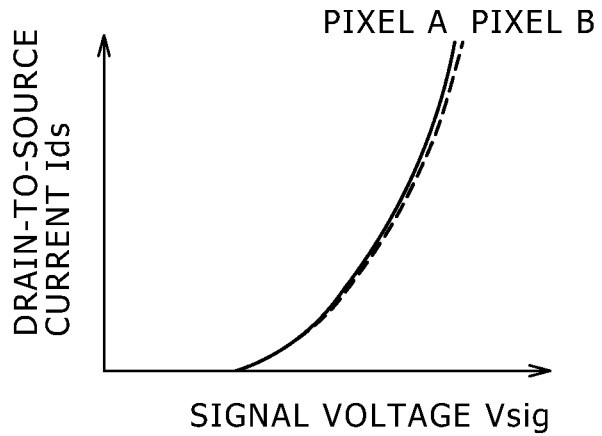

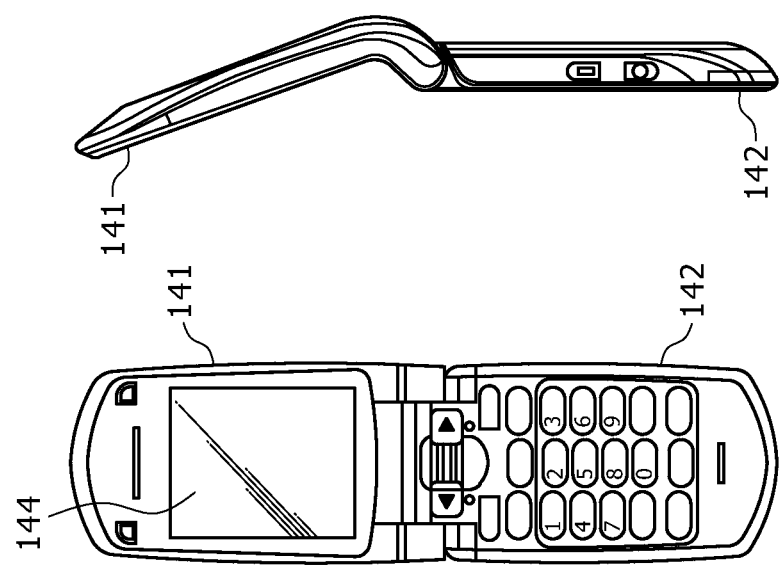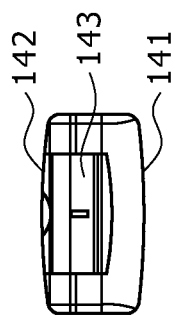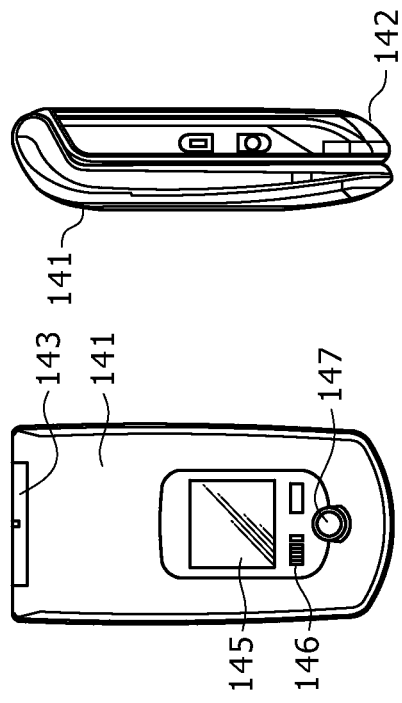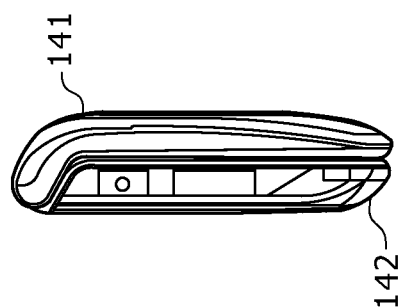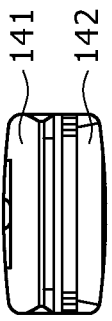

DISPLAY DEVICE, METHOD OF LAYING OUT LIGHT EMITTING ELEMENTS, AND ELECTRONIC DEVICE

This is a Continuation application of U.S. patent application Ser. No. 13/763,745, filed Feb. 11, 2013, which is a Continuation application of U.S. patent application Ser. No. 12/385,648 filed Apr. 15, 2009, which in turn claims priority from Japanese Application No. 2008-132854 filed in the Japan Patent Office on May 21, 2008, the entire contents of which being incorporated herein by reference.

BACKGROUND OF THE INVENTION

1. Field of the Invention
2. Description of the Related Art

Recently, flat-panel type display devices in which pixels (pixel circuits) are arranged in the form of a matrix have spread rapidly in a field of display devices displaying images. As one of the flat-panel type display devices, there is a display device using a current-driven type electrooptic element whose light emission luminance changes according to the value of a current flowing through the device as light emitting elements of pixels. As a current-driven type electrooptic element, an organic EL (Electro Luminescence) element utilizing a phenomenon of light being emitted when an electric field is applied to an organic thin film is known.

An organic EL display device using the organic EL element as electrooptic elements of pixels has the following features. The organic EL element can be driven by an application voltage of 10 V or lower, and thus consumes low power. Because the organic EL element is a self-luminous element, as compared with a liquid crystal display device that displays an image by controlling the intensity of light from a light source in a liquid crystal in each pixel, the organic EL display device provides high image visibility, and is easily reduced in weight and thickness because an illuminating member such as a backlight or the like is not required. Further, because the organic EL element has a very high response speed of a few μsec or so, no afterimage occurs at a time of displaying a moving image.

As with the liquid crystal display device, the organic EL display device can adopt a simple (passive) matrix system and an active matrix system as a driving system of the organic EL display device. However, while having a simple structure, a simple matrix type display device presents for example a problem of difficulty in realizing a large and high-definition display device because the emission period of an electrooptic element is reduced by an increase in the number of scanning lines (that is, the number of pixels).

Therefore an active matrix type display device that controls current flowing through an electrooptic element by an active element, for example an insulated gate field effect transistor provided within a same pixel circuit as the electrooptic element has recently been actively developed. A TFT (Thin Film Transistor) is typically used as the insulated gate field effect transistor. The active matrix type display device makes it easy to realize a large and high-definition display device because the electrooptic element continues emitting light over the period of one frame.

It is generally known that the I-V characteristic (current-voltage characteristic) of the organic EL element is degraded with the passage of time (so-called secular degradation). In a pixel circuit using an N-channel type TFT in particular as a transistor that current-drives an organic EL element (which transistor will hereinafter be described as a "driving transistor"), when the I-V characteristic of the organic EL element is degraded with the passage of time, the gate-to-source voltage Vgs of the driving transistor changes. As a result, the light emission luminance of the organic EL element changes. This is caused by the connection of the organic EL element to the source electrode side of the driving transistor.

This will be described more specifically. The source potential of the driving transistor is determined by an operating point of the driving transistor and the organic EL element. When the I-V characteristic of the organic EL element is degraded, the operating point of the driving transistor and the organic EL element varies. Thus, even when a same voltage is applied to the gate of the driving transistor, the source potential of the driving transistor changes. Thereby, the gate-to-source voltage Vgs of the driving transistor changes, and therefore the value of current flowing through the driving transistor changes. As a result, the value of current flowing through the organic EL element also changes, so that the light emission luminance of the organic EL element changes.

Further, in a pixel circuit using a polysilicon TFT, in addition to a secular degradation in the I-V characteristic of an organic EL element, transistor characteristics of a driving transistor vary with the passage of time, and the transistor characteristics vary from pixel to pixel due to variations in a manufacturing process. That is, the transistor characteristics of the driving transistor vary between individual pixels. The transistor characteristics include for example the threshold voltage Vth of the driving transistor and the mobility μ of a semiconductor thin film forming the channel of the driving transistor (which mobility μ will hereinafter be described simply as the "mobility μ of the driving transistor").

When the transistor characteristics of the driving transistor differ in each pixel, the value of current flowing through the driving transistor varies in each pixel. Thus, even when a same voltage is applied to the gates of driving transistors in respective pixels, the light emission luminance of the organic EL element varies between the pixels. As a result, screen uniformity is impaired.

Accordingly, in order to hold the light emission luminance of the organic EL element constant without being affected by secular degradation in the I-V characteristic of the organic EL element or secular changes in the transistor characteristics of the driving transistor, for example, the pixel circuit is provided with various correcting (compensating) functions (see Japanese Patent Laid-Open No. 2006-133542, for example).

The correcting functions include for example a function of compensating for variations in the characteristic of the organic EL element, a function of correcting for variations in the threshold voltage Vth of the driving transistor, and a function of correcting for variations in the mobility μ of the driving transistor. Hereinafter, correction for variations in the threshold voltage Vth of the driving transistor will be referred to as "threshold value correction," and correction for variations in the mobility μ of the driving transistor will be referred to as "mobility correction."

By thus providing each pixel circuit with the various functions, the light emission luminance of the organic EL element can be held constant without being affected by secular degradation in the I-V characteristic of the organic EL element or secular change in the transistor characteristics of the driving transistor. As a result, the display quality of the organic EL display device can be improved.

SUMMARY OF THE INVENTION

The characteristics of a transistor forming a pixel circuit (which transistor may be described as a "pixel transistor"), for example a driving transistor vary with the passage of stress application time, that is, light emission time. Then, a panel current value, specifically the value of a current flowing through an organic EL element changes. As a result, the light emission luminance of the organic EL element varies. FIG. 21 shows a current ratio to an initial current value with respect to the emission period of an organic EL element for red light.

In a display device for color display, one pixel is formed by a unit of three sub-pixels, which are a sub-pixel emitting red light (R), a sub-pixel emitting green light (G), and a sub-pixel emitting blue light (B). The organic EL element has a device structure formed on a substrate on which a pixel transistor and the like are formed with a planarizing film interposed between the organic EL element and the substrate (which device structure will be described later in detail).

In such a device structure, the three sub-pixels of RGB forming a unit are disposed so as to be adjacent to each other. Thus, a part (so-called leakage light) of light emitted by an organic EL element of a certain color irradiates adjacent pixel transistors of pixels of the other colors. Of the pieces of emitted light of RGB, the blue light has highest energy. Thus, there is mainly a strong effect of the blue light on the pixel transistors of RG.

Therefore, when the pixel transistor of the adjacent pixel of R, for example, is irradiated with a part of the blue light emitted by the organic EL element of B, the characteristics of the pixel transistor of R change more greatly than when the pixel transistor of R is not irradiated. Because of the variation in the characteristics of the pixel transistor, as shown in FIG. 21, the current ratio at a time of emission of the blue light of the organic EL element emitting red light is lower than at a time of non-emission of the blue light.

While variation in the characteristics of a pixel transistor due to an effect of leakage light from the B pixel in the pixel emitting red light has been described above, the same is true for the pixel emitting green light. A pixel transistor in the pixel of B is also irradiated with the light emitted by the organic EL element of the pixel of B itself. As a result, change in the characteristics of the pixel transistor varies from color to color.

Thus, when the characteristics of the pixel transistor change due to the effect of leakage light from an adjacent pixel, and the change in the characteristics varies from color to color, a current ratio to an initial current value with respect to emission time varies from color to color. Therefore a problem occurs in that a white balance (balance between pieces of emitted light of RGB) is disturbed depending on an image being displayed.

Incidentally, for example a measure of adopting a leakage light preventing structure using a rib or the like may be taken to avoid the effect of light emitted by an adjacent pixel. However, the provision of a leakage light preventing structure complicates a device structure.

It is accordingly desirable to provide a display device that can reduce variations in changes in the characteristics of the pixel transistor from color to color due to the effect of leakage light from an adjacent pixel, a method of laying out light emitting elements in the display device, and an electronic device using the display device.

According to an embodiment of the present invention there is provided a display device in which light emitting elements of a plurality of colors including a light emitting element emitting blue light are formed in each pixel on a substrate on which a transistor is formed for each sub-pixel, and a plurality of pixels formed with sub-pixels of the plurality of colors as a unit are arranged in a form of a matrix, and relative positional relation between transistors of sub-pixels of respective light emission colors including blue light and a light emitting section of a light emitting element emitting said blue light is laid out such that distances between the transistors of the sub-pixels of the respective light emission colors including said blue light and the light emitting section of the light emitting element emitting said blue light are equal to each other for the respective colors.

According to another embodiment of the present invention there is provided a method of laying out light emitting elements, in laying out light emitting elements in a display device in which light emitting elements of a plurality of colors including a light emitting element emitting blue light are formed in each pixel on a substrate on which a transistor is formed for each sub-pixel, and a plurality of pixels formed with sub-pixels of the plurality of colors as a unit are arranged in a form of a matrix, said method including the step of laying out relative positional relation between transistors of sub-pixels of respective light emission colors including blue light and a light emitting section of a light emitting element emitting said blue light such that distances between the transistors of the sub-pixels of the respective light emission colors including said blue light and the light emitting section of the light emitting element emitting said blue light are equal to each other for the respective colors.

According to yet another embodiment of the present invention there is provided a method of laying out light emitting elements, in laying out light emitting elements in a display device in which light emitting elements of a plurality of colors including a light emitting element emitting blue light are formed in each pixel on a substrate on which a transistor is formed for each sub-pixel, and a plurality of pixels formed with sub-pixels of the plurality of colors as a unit are arranged in a form of a matrix, said method including the step of laying out relative positional relation between transistors of sub-pixels of respective light emission colors including blue light and a light emitting section of a light emitting element emitting said blue light such that a part of the blue light equally irradiates the transistors of the sub-pixels of the other light emission colors.

Further, according to an embodiment of the present invention there is provided an electronic device having a display device in which light emitting elements of a plurality of colors including a light emitting element emitting blue light are formed in each pixel on a substrate on which a transistor is formed for each sub-pixel, and a plurality of pixels formed with sub-pixels of the plurality of colors as a unit are arranged in a form of a matrix, wherein relative positional relation between transistors of sub-pixels of respective light emission colors including blue light and a light emitting section of a light emitting element emitting said blue light is laid out such that distances between the transistors of the sub-pixels of the respective light emission colors including said blue light and the light emitting section of the light emitting element emitting said blue light are equal to each other for the respective colors.

According to the present invention, variations in changes in characteristics of the pixel transistor from color to color due to the effect of leakage light from an adjacent pixel can be reduced. Thereby, a white balance can be maintained without depending on an image being displayed, so that a display image of excellent display quality can be obtained.

BRIEF DESCRIPTION OF THE DRAWINGS

FIG. 3 is a timing waveform chart of assistance in explaining the circuit operation of the organic EL display device according to the present example of application in which a pixel has a 2Tr circuit configuration as a basic configuration;

FIGS. 8A, 8B, and 8C are characteristic diagrams of assistance in explaining relations between the signal voltage Vsig of a video signal and the drain-to-source current Ids of the driving transistor according to whether threshold value correction and mobility correction are performed or not;

FIGS. 20A, 20B, 20C, 20D, 20E, 20F, and 20G are diagrams showing an external appearance of a portable telephone to which the embodiments of the present invention is applied, FIG. 20A being a front view of the portable telephone in an opened state, FIG. 20B being a side view of the portable telephone in the opened state, FIG. 20C being a front view of the portable telephone in a closed state, FIG. 20D being a left side view, FIG. 20E being a right side view, FIG. 20F being a top view, and FIG. 20G being a bottom view.

DETAILED DESCRIPTION OF THE PREFERRED EMBODIMENTS

Preferred embodiments of the present invention will hereinafter be described in detail with reference to the drawings.

[System]

Figure 1:
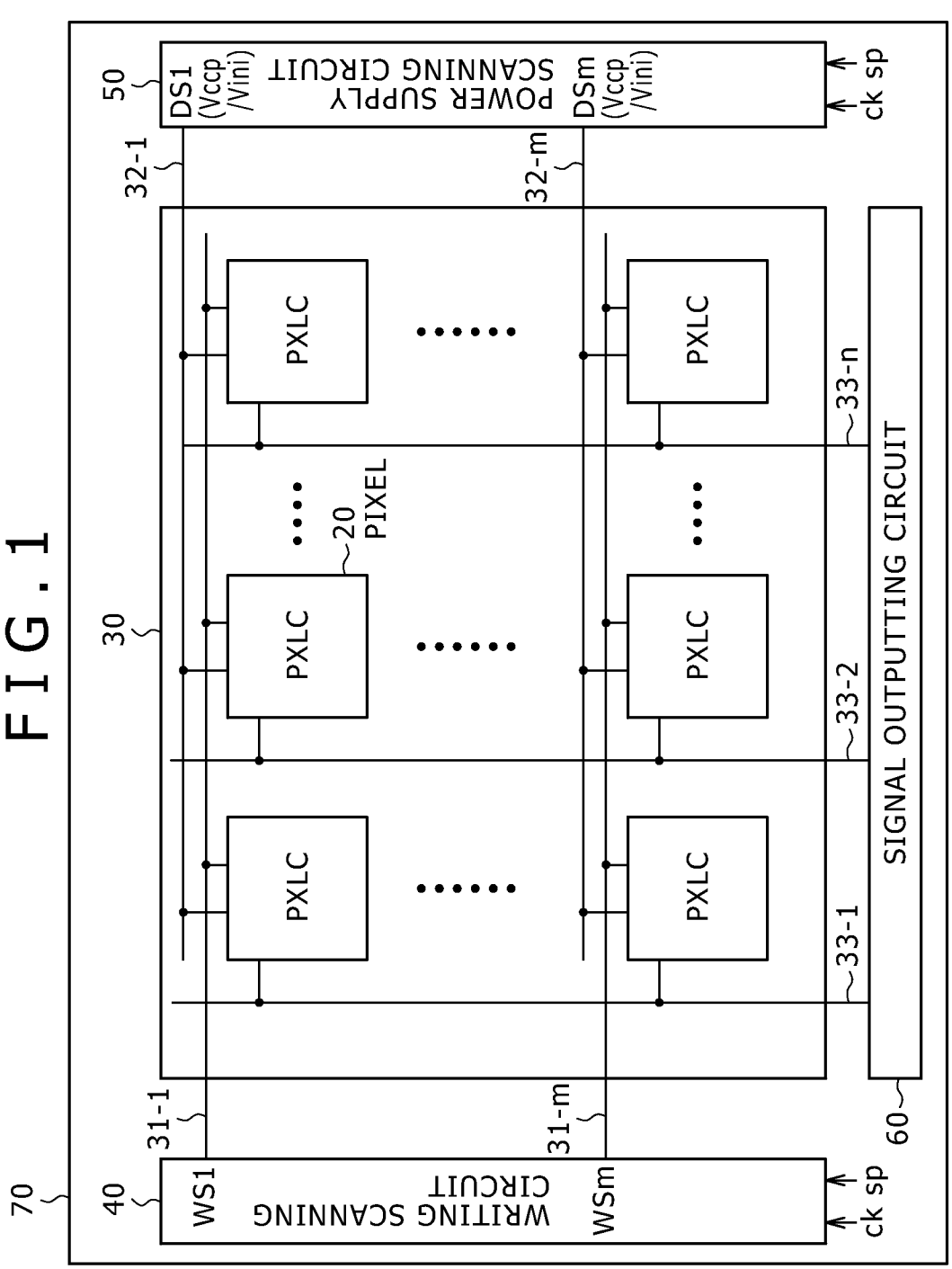
FIG. 1 is a system configuration diagram showing an outline of a configuration of an organic EL display device to which embodiments of the present invention is applied.

FIG. 1 is a system configuration diagram showing an outline of a configuration of an active matrix type display device to which the embodiments of the present invention is applied. Description in the following will be made by taking as an example an active matrix type organic EL display device using a current-driven type electrooptic element whose light emission luminance changes according to the value of a current flowing through the device, for example an organic EL element as light emitting elements of pixels (pixel circuits).

As shown in FIG. 1, the organic EL display device 10 according to the present example of application has a plurality of pixels 20 including light emitting elements, a pixel array section 30 in which the pixels 20 are arranged two-dimensionally in the form of a matrix, and a driving section disposed on the periphery of the pixel array section 30. The driving section drives each pixel 20 of the pixel array section 30. The driving section includes for example a writing scanning circuit 40, a power supply scanning circuit 50, and a signal outputting circuit 60.

In this case, the organic EL display device 10 is capable of color display. One pixel is formed with a plurality of sub-pixels as a unit, and the individual sub-pixels correspond to the pixel 20. More specifically, in a display device for color display, as described above, one pixel is formed with three sub-pixels as a unit, the three sub-pixels being a sub-pixel emitting red light, a sub-pixel emitting green light, and a sub-pixel emitting blue light.

However, one pixel is not limited to the combination of sub-pixels of three primary colors of RGB, and one pixel can be formed by further adding a sub-pixel of one color or sub-pixels of a plurality of colors to the sub-pixels of the three primary colors. More specifically, for example, one pixel can be formed by adding a sub-pixel emitting white light (W) to improve luminance, or one pixel can be formed by adding at least one sub-pixel emitting light of a complementary color to expand a color reproduction range.

The pixel array section 30 has scanning lines 31-1 to 31-$m$ and power supply lines 32-1 to 32-$m$ arranged for each pixel row along a row direction (direction of arrangement of pixels of a pixel row) in an arrangement of the pixels 20 of m rows and n columns. Further, signal lines 33-1 to 33-$n$ are arranged for each pixel column along a column direction (direction of arrangement of pixels of a pixel column).

The scanning lines 31-1 to 31-$m$ are respectively connected to output terminals for the corresponding rows of the writing scanning circuit 40. The power supply lines 32-1 to 32-$m$ are respectively connected to output terminals for the corresponding rows of the power supply scanning circuit 50. The signal lines 33-1 to 33-$n$ are respectively connected to output terminals for the corresponding columns of the signal outputting circuit 60.

The pixel array section 30 is usually formed on a transparent insulating substrate such as a glass substrate or the like. The organic EL display device 10 thereby has a plane type (flat type) panel structure. The driving circuit of each pixel 20 in the pixel array section 30 can be formed using an amorphous silicon TFT or a low-temperature polysilicon TFT. When the low-temperature polysilicon TFT is used, the writing scanning circuit 40, the power supply scanning circuit 50, and the signal outputting circuit 60 can also be mounted on a display panel (substrate) 70 on which the pixel array section 30 is formed.

The writing scanning circuit 40 is formed by a shift register sequentially shifting (transferring) a start pulse sp in order in synchronism with a clock pulse ck, or the like. At a time of writing a video signal to the pixels 20 of the pixel array section 30, the writing scanning circuit 40 sequentially supplies a writing scanning signal WS (WS1 to WSm) to the scanning lines 31-1 to 31-m, and thereby scans the pixels 20 of the pixel array section 30 in row units in order (line-sequential scanning).

The power supply scanning circuit 50 is formed by a shift register sequentially shifting (transferring) the start pulse sp in order in synchronism with the clock pulse ck, or the like. The power supply scanning circuit 50 supplies a power supply potential DS (DS1 to DSm) changing between a first power supply potential Vccp and a second power supply potential Vini lower than the first power supply potential Vccp to the power supply lines 32-1 to 32-m in synchronism with the line-sequential scanning of the writing scanning circuit 40. The emission/non-emission of the pixels 20 is controlled by changing the power supply signal DS to Vccp/Vini.

The signal outputting circuit 60 appropriately selects and outputs one of the signal voltage Vsig of a video signal corresponding to luminance information supplied from a signal supplying source (not shown) (the signal voltage Vsig may hereinafter be described simply as a "signal voltage") and a reference potential Vofs. The signal voltage Vsig or the reference potential Vofs output from the signal outputting circuit 60 is written to the pixels 20 of the pixel array section 30 in row units via the signal lines 33-1 to 33-n. That is, the signal outputting circuit 60 employs a line-sequential writing driving mode in which the signal voltage Vsig is written in row (line) units.

(Pixel Circuit)

Figure 2:
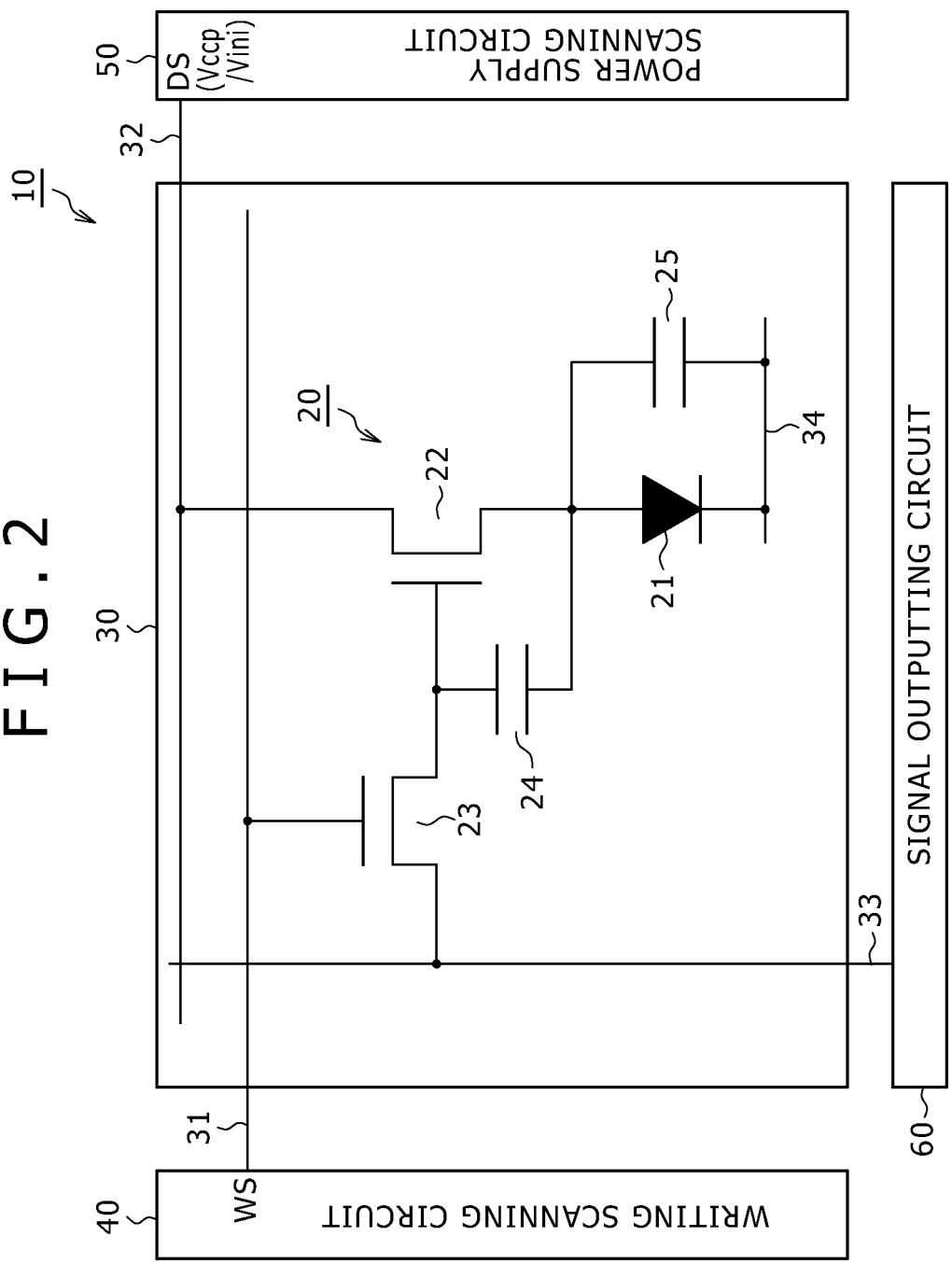
FIG. 2 is a circuit diagram showing an example of circuit configuration of a pixel.

FIG. 2 is a circuit diagram showing an example of circuit configuration of a pixel (pixel circuit) 20.

As shown in FIG. 2, the pixel 20 is formed by a current-driven type electrooptic element whose light emission luminance changes according to the value of a current flowing through the device, for example an organic EL element 21, and a driving circuit driving the organic EL element 21. The organic EL element 21 has a cathode electrode connected to a common power supply line 34 commonly wired to all the pixels 20 (so-called solid wiring).

The driving circuit driving the organic EL element 21 includes a driving transistor 22, a writing transistor 23, a storage capacitor 24, and an auxiliary capacitance 25. In this case, an N-channel type TFT is used as the driving transistor 22 and the writing transistor 23. However, the combination of the conduction type of the driving transistor 22 and the conduction type of the writing transistor 23 is a mere example, and the present invention is not limited to the above combination.

Incidentally, when an N-channel type TFT is used as the driving transistor 22 and the writing transistor 23, an amorphous silicon (a-Si) process can be used. The use of the a-Si process can reduce the cost of the substrate on which the TFTs are made, and in turn reduce the cost of the organic EL display device 10. In addition, when the driving transistor 22 and the writing transistor 23 are of a same conduction type, both the transistors 22 and 23 can be made by a same process, and thus contribute to reduction in cost.

The driving transistor 22 has one electrode (source/drain electrode) connected to the anode electrode of the organic EL element 21, and has another electrode (drain/source electrode) connected to the power supply line 32 (power supply lines 32-1 to 32-m).

The writing transistor 23 has one electrode (source/drain electrode) connected to the signal line 33 (signal lines 33-1 to 33-n), and has another electrode (drain/source electrode) connected to the gate electrode of the driving transistor 22. The gate electrode of the writing transistor 23 is connected to the scanning line 31 (scanning lines 31-1 to 31-m).

In the driving transistor 22 and the writing transistor 23, the one electrode refers to metallic wiring electrically connected to a source/drain region, and the other electrode refers to metallic wiring electrically connected to a drain/source region. Depending on potential relation between the one electrode and the other electrode, the one electrode is the source electrode or the drain electrode, and the other electrode is the drain electrode or the source electrode.

The storage capacitor 24 has one electrode connected to the gate electrode of the driving transistor 22, and has another electrode connected to the other electrode of the driving transistor 22 and the anode electrode of the organic EL element 21.

The auxiliary capacitance 25 has one electrode connected to the anode electrode of the organic EL element 21, and has another electrode connected to the common power supply line 34. The auxiliary capacitance 25 is provided as required in order to supply a lack of capacitance of the organic EL element 21 and increase a gain in writing a video signal to the storage capacitor 24. That is, the auxiliary capacitance 25 is not an essential constituent element, and can be omitted when the equivalent capacitance of the organic EL element 21 is sufficiently large.

While the other electrode of the auxiliary capacitance 25 is connected to the common power supply line 34 in this case, the part to which the other electrode of the auxiliary capacitance 25 is connected is not limited to the common power supply line 34, and it suffices for the part to which the other electrode of the auxiliary capacitance 25 is connected to be a node of a fixed potential. Connecting the other electrode of the auxiliary capacitance 25 to a fixed potential can achieve the intended objects of supplying a lack of capacitance of the organic EL element 21 and increase the gain in writing a video signal to the storage capacitor 24.

In the pixel 20 of the above configuration, the writing transistor 23 is set in a conducting state by responding to a High-active writing scanning signal WS applied from the writing scanning circuit 40 to the gate electrode of the writing transistor 23 via the scanning line 31. Thereby, the writing transistor 23 samples the signal voltage Vsig of a video signal corresponding to luminance information or the reference potential Vofs, the signal voltage Vsig or the reference potential Vofs being supplied from the signal outputting circuit 60 via the signal line 33, and writes the signal voltage Vsig or the reference potential Vofs into the pixel 20. The written signal voltage Vsig or the written reference potential Vofs is applied to the gate electrode of the driving transistor 22, and is also retained by the storage capacitor 24.

When the potential DS of the power supply line 32 (power supply lines 32-1 to 32-m) is the first power supply potential Vccp, the driving transistor 22 operates in a saturation region with the one electrode serving as a drain electrode and with the other electrode serving as a source electrode. Thereby, the driving transistor 22 is supplied with a current from the power supply line 32, and light-emission-drives the organic EL element 21 by current driving. More specifically, the driving transistor 22 operates in the saturation region and thereby supplies a driving current having a current value corresponding to the voltage value of the signal voltage Vsig retained by the storage capacitor 24 to the organic EL element 21 to make the organic EL element 21 emit light by current-driving the organic EL element 21.

Further, when the power supply potential DS is changed from the first power supply potential Vccp to the second power supply potential Vini, the driving transistor 22 operates as a switching transistor with the one electrode serving as a source electrode and with the other electrode serving as a drain electrode. The driving transistor 22 thereby stops supplying the driving current to the organic EL element 21 to set the organic EL element 21 in a non-emission state. That is, the driving transistor 22 also has a function of a transistor that controls the emission/non-emission of the organic EL element 21.

A period during which the organic EL element 21 is in a non-emission state (non-emission period) is provided by the switching operation of the driving transistor 22 to control a ratio (duty) between the emission period and the non-emission period of the organic EL element 21. This duty control can reduce an afterimage blur involved in light emission of pixels over one frame period, and thus achieve more excellent image quality of a moving image in particular.

In this case, the reference potential Vofs selectively supplied from the signal outputting circuit 60 via the signal line 33 is a potential serving as a reference for the signal voltage Vsig of the video signal corresponding to the luminance information (for example a potential corresponding to the black level of the video signal).

Of the first power supply potential Vccp and the second power supply potential Vini selectively supplied from the power supply scanning circuit 50 via the power supply line 32, the first power supply potential Vccp is a power supply potential for supplying the driving current for light emission driving of the organic EL element 21 to the driving transistor 22. The second power supply potential Vini is a power supply potential for applying a reverse bias to the organic EL element 21. The second power supply potential Vini is set lower than the reference potential Vofs, or for example, letting Vth be the threshold voltage of the driving transistor 22, the second power supply potential Vini is set lower than Vofs−Vth and preferably set sufficiently lower than Vofs−Vth.

As is clear from the above description, the pixels 20 in the organic EL display device 10 according to the present example of application has a circuit configuration including two transistors, which are the driving transistor 22 and the writing transistor 23, as a basic configuration. However, the basic configuration of the pixels 20 is not limited to the 2Tr circuit configuration including the two transistors.

(Circuit Operation of Organic El Display Device)

The circuit operation of the organic EL display device 10 formed with the pixels 20 of the above-described configuration arranged two-dimensionally in the form of a matrix will next be described with reference to operation explanatory diagrams of FIGS. 4A, 4B, 4C, and 4D and FIGS. 5A, 5B, 5C, and 5D on the basis of a timing waveform chart of FIG. 3. Incidentally, in the operation explanatory diagrams of FIGS. 4A to 4D and FIGS. 5A to 5D, the writing transistor 23 is represented by the symbol of a switch in order to simplify the drawings.

The timing waveform chart of FIG. 3 shows changes in potential (writing scanning signal) WS of the scanning line 31 (31-1 to 31-$m$), changes in potential (power supply potential) DS of the power supply line 32 (32-1 to 32-$m$), and changes in the gate potential Vg and the source potential Vs of the driving transistor 22. In addition, the waveform of the gate potential Vg is represented by alternate long and short dash lines, and the waveform of the source potential Vs is represented by a dotted line, so that the two waveforms can be distinguished from each other.

<Emission Period of Preceding Frame>

A period before time t1 in the timing waveform chart of FIG. 3 is an emission period of the organic EL element 21 in a preceding frame (field). In the emission period of the preceding frame, the potential DS of the power supply line 32 is the first power supply potential (hereinafter described as a "high potential") Vccp, and the writing transistor 23 is in a non-conducting state.

Figure 4A:
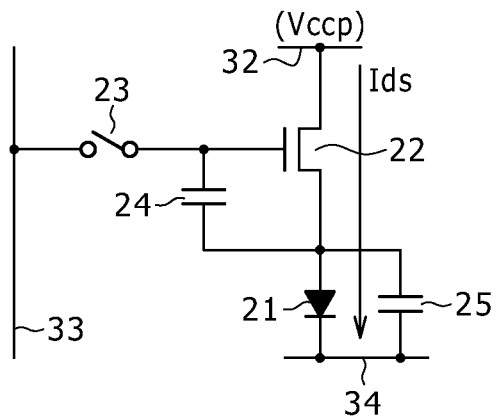
FIGS. 4A, 4B, 4C, and 4D are diagrams (1) of assistance in explaining the circuit operation of the organic EL display device according to the present example of application.

The driving transistor 22 is designed to operate in the saturation region at this time. Thereby, as shown in FIG. 4A, a driving current (drain-to-source current) Ids corresponding to the gate-to-source voltage Vgs of the driving transistor 22 is supplied from the power supply line 32 through the driving transistor 22 to the organic EL element 21. The organic EL element 21 thus emits light at a luminance corresponding to the current value of the driving current Ids.

<Threshold Value Correction Preparatory Period>

Figure 4B:
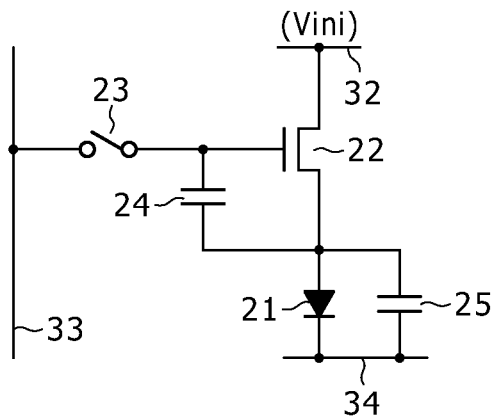

A new frame (present frame) of line-sequential scanning begins at time t1. As shown in FIG. 4B, the potential DS of the power supply line 32 is changed from the high potential Vccp to the second power supply potential (hereinafter described as a "low potential") Vini sufficiently lower than Vofs−Vth with respect to the reference potential Vofs of the signal line 33.

Let Vthel be the threshold voltage of the organic EL element 21, and Vcath be the potential of the common power supply line 34 (cathode potential). At this time, when the low potential Vini is set to be Vini<Vthel+Vcath, the source potential Vs of the driving transistor 22 becomes substantially equal to the low potential Vini, and thus the organic EL element 21 is set in a reverse-biased state and quenched.

Figure 4C:
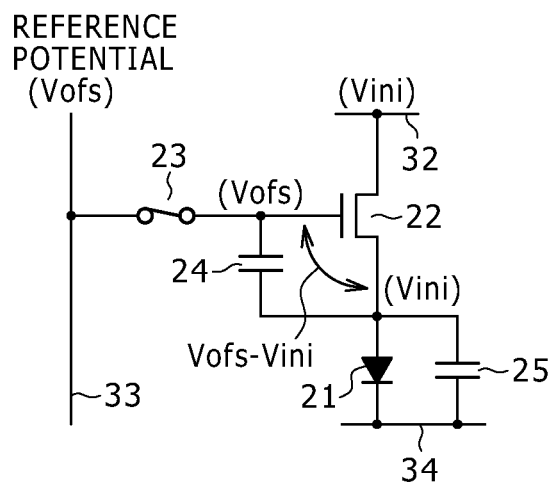

Next, at time t2, the potential WS of the scanning line 31 makes a transition from a low potential side to a high potential side, whereby the writing transistor 23 is set in a conducting state, as shown in FIG. 4C. At this time, because the reference potential Vofs is supplied from the signal outputting circuit 60 to the signal line 33, the gate potential Vg of the driving transistor 22 becomes the reference potential Vofs. The source potential Vs of the driving transistor 22 is the potential Vini, which is sufficiently lower than the reference potential Vofs.

At this time, the gate-to-source voltage Vgs of the driving transistor 22 is Vofs−Vini. A threshold value correcting process to be described later cannot be performed unless Vofs−Vini is larger than the threshold voltage Vth of the driving transistor 22. Therefore a potential relation such that Vofs−Vini>Vth needs to be set.

The process of thus initializing the gate potential Vg and the source potential Vs of the driving transistor 22 by fixing (establishing) the gate potential Vg of the driving transistor 22 to the reference potential Vofs and the source potential Vs of the driving transistor 22 to the low potential Vini is the preparatory (threshold value correction preparatory) process before a threshold value correcting process to be described later is performed. Thus, the reference potential Vofs and the low potential Vini are respective initializing potentials for the gate potential Vg and the source potential Vs of the driving transistor 22.

<Threshold Value Correcting Period>

Figure 4D:
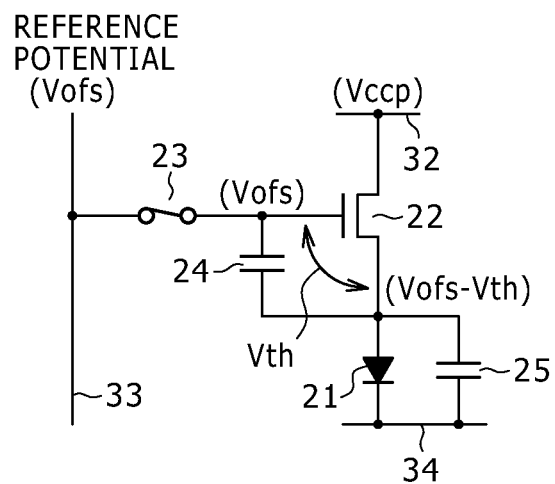

Next, when the potential DS of the power supply line 32 is changed from the low potential Vini to the high potential Vccp at time t3 as shown in FIG. 4D, a threshold value correcting process begins in a state of the gate potential Vg of the driving transistor 22 being retained. That is, the source potential Vs of the driving transistor 22 starts rising toward a potential obtained by subtracting the threshold voltage Vth of the driving transistor 22 from the gate potential Vg.

In this case, for convenience, with the initializing potential Vofs of the gate electrode of the driving transistor 22 as a reference, the process of changing the source potential Vs toward the potential obtained by subtracting the threshold voltage Vth of the driving transistor 22 from the initializing potential Vofs is referred to as a threshold value correcting process. As the threshold value correcting process progresses, the gate-to-source voltage Vgs of the driving transistor 22 eventually converges to the threshold voltage Vth of the driving transistor 22. A voltage corresponding to the threshold voltage Vth is retained by the storage capacitor 24.

Incidentally, suppose that in a period in which the threshold value correcting process is performed (threshold value correcting period), in order for a current to flow only to the side of the storage capacitor 24 and not to flow to the side of the organic EL element 21, the potential Vcath of the common power supply line 34 is set such that the organic EL element 21 is in a cutoff state.

Figure 5A:
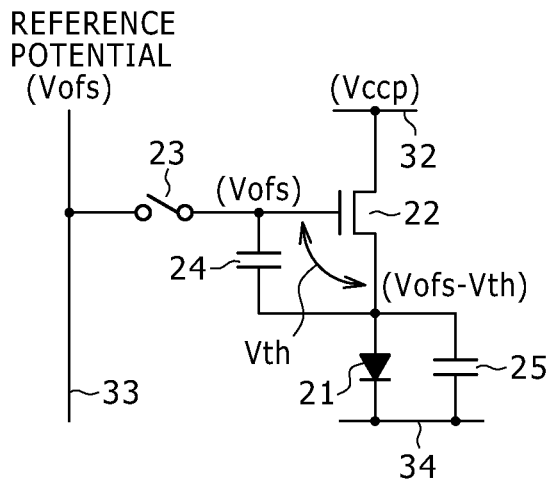
FIGS. 5A, 5B, 5C, and 5D are diagrams (2) of assistance in explaining the circuit operation of the organic EL display device according to the present example of application.

Next, the potential WS of the scanning line 31 makes a transition to the low potential side at time t4, whereby the writing transistor 23 is set in a non-conducting state as shown in FIG. 5A. At this time, the gate electrode of the driving transistor 22 is electrically disconnected from the signal line 33, and is thereby set in a floating state. However, because the gate-to-source voltage Vgs is equal to the threshold voltage Vth of the driving transistor 22, the driving transistor 22 is in a cutoff state. Therefore the drain-to-source current Ids does not flow through the driving transistor 22.

<Signal Writing and Mobility Correcting Period>

Figure 5B:
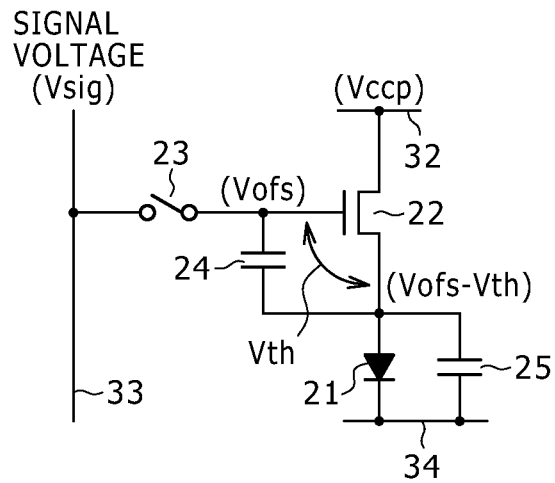
Figure 5C:
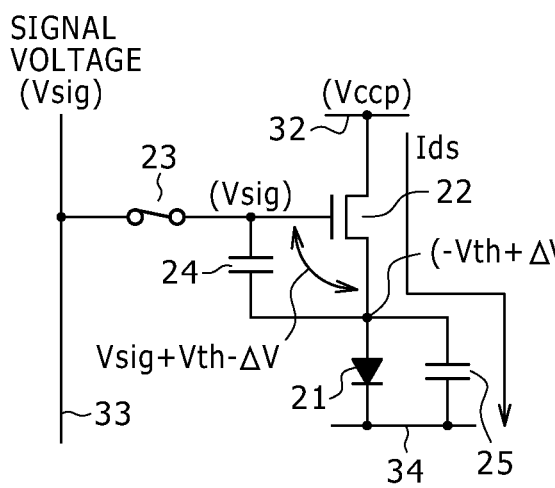

Next, at time t5, as shown in FIG. 5B, the potential of the signal line 33 is changed from the reference potential Vofs to the signal voltage Vsig of the video signal. Then, at time t6, the potential WS of the scanning line 31 makes a transition to the high potential side. Thereby, as shown in FIG. 5C, the writing transistor 23 is set in a conducting state to sample the signal voltage Vsig of the video signal and write the signal voltage Vsig into the pixel 20.

As a result of the writing of the signal voltage Vsig by the writing transistor 23, the gate potential Vg of the driving transistor 22 becomes the signal voltage Vsig. At a time of driving the driving transistor 22 by the signal voltage Vsig of the video signal, the threshold voltage Vth of the driving transistor 22 is cancelled out by the voltage retained by the storage capacitor 24 and corresponding to the threshold voltage Vth. Details of principles of this threshold value cancellation will be described later.

At this time, the organic EL element 21 is in a cutoff state (state of high impedance). Thus, a current (drain-to-source current Ids) flowing from the power supply line 32 to the driving transistor 22 according to the signal voltage Vsig of the video signal flows into the auxiliary capacitance 25. Thus, the charging of the auxiliary capacitance 25 is started.

The charging of the auxiliary capacitance 25 raises the source potential Vs of the driving transistor 22 with the passage of time. At this time, a variation in the threshold voltage Vth of the driving transistor 22 in each pixel is already cancelled, and the drain-to-source current Ids of the driving transistor 22 is dependent on mobility μ of the driving transistor 22.

Suppose that in this case, a ratio of the gate-to-source voltage Vgs retained by the storage capacitor 24 to the signal voltage Vsig of the video signal, that is, a writing gain is one (ideal value). Then, the source potential Vs of the driving transistor 22 rises to a potential Vofs−Vth+ΔV, whereby the gate-to-source voltage Vgs of the driving transistor 22 is Vsig−Vofs+Vth−ΔV.

That is, the rise ΔV in the source potential Vs of the driving transistor 22 is subtracted from the voltage (Vsig−Vofs+Vth) retained by the storage capacitor 24, or in other words, the rise ΔV in the source potential Vs of the driving transistor 22 acts to discharge the charge stored in the storage capacitor 24, so that a negative feedback is applied. Thus, the rise ΔV in the source potential Vs is a feedback amount of the negative feedback.

Thus applying a negative feedback to the gate-to-source voltage Vgs by the feedback amount ΔV corresponding to the drain-to-source current Ids flowing through the driving transistor 22 can cancel out the dependence of the drain-to-source current Ids of the driving transistor 22 on the mobility μ. This canceling process is a mobility correcting process that corrects a variation in the mobility μ of the driving transistor 22 in each pixel.

More specifically, the higher the signal amplitude Vin (=Vsig−Vofs) of the video signal written to the gate electrode of the driving transistor 22, the larger the drain-to-source current Ids, and thus the greater the absolute value of the feedback amount ΔV of the negative feedback. Therefore the mobility correcting process is performed according to light emission luminance level.

In addition, when the signal amplitude Vin of the video signal is fixed, the higher the mobility μ of the driving transistor 22, the greater the absolute value of the feedback amount ΔV of the negative feedback, so that a variation in mobility μ in each pixel can be eliminated. Therefore the feedback amount ΔV of the negative feedback can also be said to be a correction amount of mobility correction. Details of principles of the mobility correction will be described later.

<Emission Period>

Figure 5D:
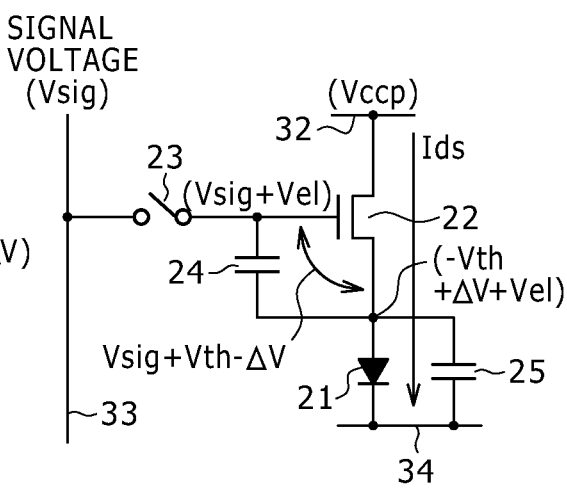

Next, the potential WS of the scanning line 31 makes a transition to the low potential side at time t7, whereby the writing transistor 23 is set in a non-conducting state as shown in FIG. 5D. Thereby, the gate electrode of the driving transistor 22 is electrically disconnected from the signal line 33, and is thus set in a floating state.

When the gate electrode of the driving transistor 22 is in a floating state, the gate potential Vg of the driving transistor 22 varies in such a manner as to be interlocked with variation in the source potential Vs of the driving transistor 22 because the storage capacitor 24 is connected between the gate and the source of the driving transistor 22. The operation of the gate potential Vg of the driving transistor 22 thus varying in such a manner as to be interlocked with variation in the source potential Vs of the driving transistor 22 is a bootstrap operation by the storage capacitor 24.

The gate electrode of the driving transistor 22 is set in a floating state, and at the same time, the drain-to-source current Ids of the driving transistor 22 starts to flow to the organic EL element 21. Thereby the anode potential of the organic EL element 21 rises according to the current Ids.

When the anode potential of the organic EL element 21 exceeds Vthel+Vcath, the driving current starts flowing through the organic EL element 21, and therefore the organic EL element 21 starts emitting light. A rise in the anode potential of the organic EL element 21 is none other than a rise in the source potential Vs of the driving transistor 22. When the source potential Vs of the driving transistor 22 rises, the gate potential Vg of the driving transistor 22 is also raised in an interlocked manner by the bootstrap operation of the storage capacitor 24.

At this time, supposing that a bootstrap gain is one (ideal value), the amount of the rise in the gate potential Vg is equal to the amount of the rise in the source potential Vs. Therefore the gate-to-source voltage Vgs of the driving transistor 22 during the emission period is maintained at a fixed level Vsig−Vofs+Vth−ΔV. Then, at time t8, the potential of the signal line 33 is changed from the signal voltage Vsig of the video signal to the reference potential Vofs.

The respective process operations of the threshold value correction preparation, the threshold value correction, the writing of the signal voltage Vsig (signal writing), and the mobility correction in the series of circuit operations described above are performed in one horizontal scanning period (H). The respective process operations of the signal writing and the mobility correction are performed in parallel with each other in a period from time t6 to time t7.

(Principles of Threshold Value Correction)

Principles of threshold value cancellation (that is, threshold value correction) of the driving transistor 22 will be described in the following. The driving transistor 22 is designed to operate in a saturation region, and thus operates as a constant-current source. Thereby a constant drain-to-source current (driving current) Ids given by the following Equation (1) is supplied from the driving transistor 22 to the organic EL element 21.

$$Ids=(1/2) \cdot \mu(W/L)Cox(Vgs-Vth)^2 \quad (1)$$

where W is the channel width of the driving transistor 22, L is the channel length of the driving transistor 22, and Cox is gate capacitance per unit area.

Figure 6:
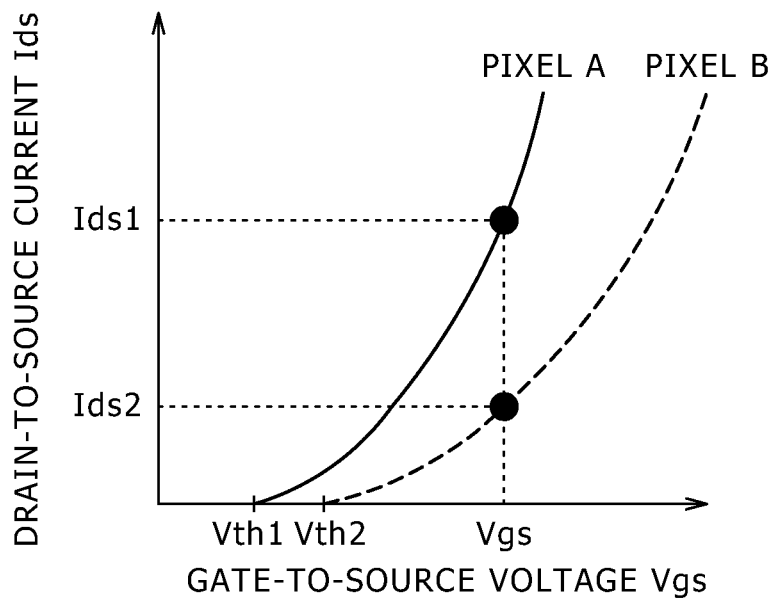
FIG. 6 is a characteristic diagram of assistance in explaining a problem caused by variations in threshold voltage Vth of a driving transistor.

FIG. 6 shows a characteristic of the drain-to-source current Ids of the driving transistor 22 versus the gate-to-source voltage Vgs of the driving transistor 22.

As shown in this characteristic diagram, without the process of cancelling variation in the threshold voltage Vth of the driving transistor 22 in each pixel, when the threshold voltage Vth is Vth1, the drain-to-source current Ids corresponding to the gate-to-source voltage Vgs is Ids1.

On the other hand, when the threshold voltage Vth is Vth2 (Vth2>Vth1), the drain-to-source current Ids corresponding to the same gate-to-source voltage Vgs is Ids2 (Ids2<Ids1). That is, when the threshold voltage Vth of the driving transistor 22 varies, the drain-to-source current Ids varies even if the gate-to-source voltage Vgs is constant.

On the other hand, in the pixel (pixel circuit) 20 of the above-described configuration, the gate-to-source voltage Vgs of the driving transistor 22 at the time of light emission is Vsig−Vofs+Vth−ΔV, as described above. Thus, when this is substituted into Equation (1), the drain-to-source current Ids is expressed by the following Equation (2).

$$Ids=(1/2) \cdot \mu(W/L)Cox(Vsig-Vofs-\Delta V)^2 \quad (2)$$

That is, the term of the threshold voltage Vth of the driving transistor 22 is cancelled, and therefore the drain-to-source current Ids supplied from the driving transistor 22 to the organic EL element 21 is not dependent on the threshold voltage Vth of the driving transistor 22. As a result, even when the threshold voltage Vth of the driving transistor 22 varies in each pixel due to variations in a process of manufacturing the driving transistor 22 or a secular change in the driving transistor 22, the drain-to-source current Ids does not vary. Therefore the light emission luminance of the organic EL element 21 can be held constant.

(Principles of Mobility Correction)

Figure 7:
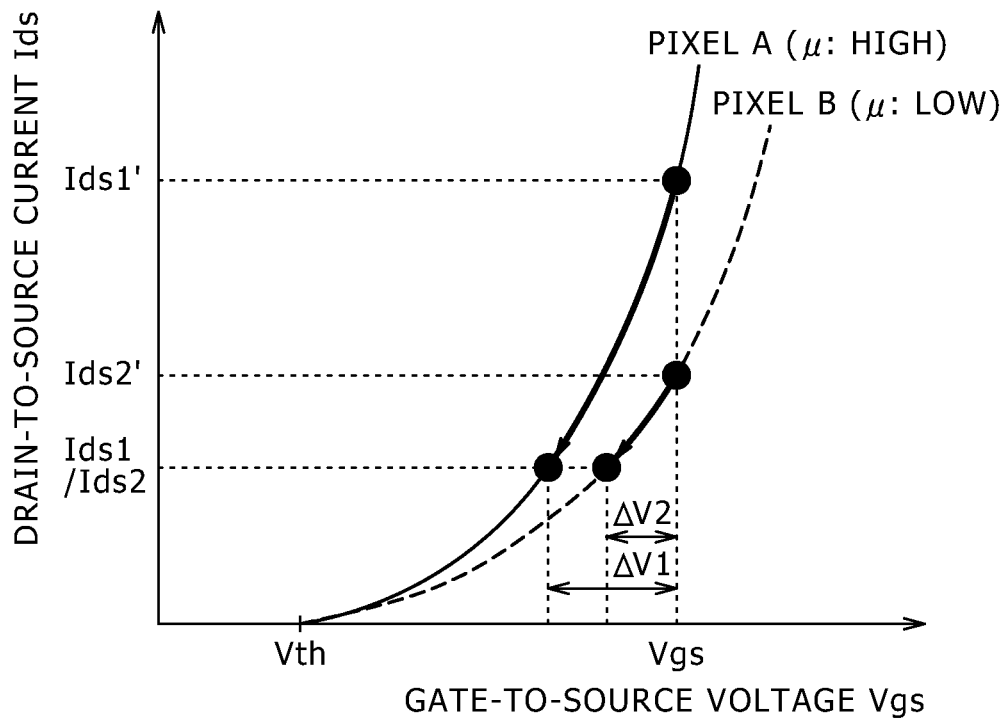
FIG. 7 is a characteristic diagram of assistance in explaining a problem caused by variations in mobility µ of the driving transistor.

Principles of the mobility correction of the driving transistor 22 will next be described. FIG. 7 shows characteristic curves in a state in which a pixel A whose driving transistor 22 has a relatively high mobility μ and a pixel B whose driving transistor 22 has a relatively low mobility μ are compared with each other. When the driving transistor 22 is formed by a polysilicon thin film transistor or the like, the mobility μ inevitably varies between pixels such as the pixel A and the pixel B.

Consideration will be given to a case where for example both pixels A and B have a signal amplitude Vin (=Vsig−Vofs) at a same level written to the gate electrodes of the driving transistors 22 with the mobility μ varying between the pixel A and the pixel B. In this case, when no correction is made for the mobility μ, a large difference occurs between a drain-to-source current Ids1' flowing in the pixel A of high mobility μ and a drain-to-source current Ids2' flowing in the pixel B of low mobility μ. A large difference in drain-to-source current Ids thus occurring between pixels due to a variation in mobility μ in each pixel impairs the uniformity of the screen.

As is clear from the above-described Equation (1) as a transistor characteristic equation, when the mobility μ is high, the drain-to-source current Ids is increased. Hence, the higher the mobility μ, the larger the feedback amount ΔV of negative feedback. As shown in FIG. 7, the feedback amount ΔV1 of the pixel A of high mobility μ is larger than the feedback amount ΔV2 of the pixel B of low mobility.

Accordingly, the mobility correcting process applies a negative feedback to the gate-to-source voltage Vgs by a feedback amount ΔV corresponding to the drain-to-source current Ids of the driving transistor 22. Thereby a larger amount of negative feedback is applied as the mobility μ is increased. As a result, variations in mobility μ in each pixel can be suppressed.

Specifically, when a correction of the feedback amount ΔV1 is applied in the pixel A of high mobility μ, the drain-to-source current Ids falls greatly from Ids1' to Ids1. On the other hand, because the feedback amount ΔV2 of the pixel B of low mobility μ is small, the drain-to-source current Ids falls from Ids2' to Ids2, and thus does not fall so greatly. Consequently, the drain-to-source current Ids1 of the pixel A and the drain-to-source current Ids2 of the pixel B become substantially equal to each other. Therefore variations in mobility μ in each pixel are corrected.

Summarizing the above, when there are a pixel A and a pixel B of different mobilities p, the feedback amount ΔV1 of the pixel A of high mobility μ is larger than the feedback amount ΔV2 of the pixel B of low mobility p. That is, the higher the mobility μ of a pixel, the larger the feedback amount ΔV, and the larger the amount of decrease in drain-to-source current Ids.

Thus, by applying a negative feedback to the gate-to-source voltage Vgs by a feedback amount ΔV corresponding to the drain-to-source current Ids of the driving transistor 22, the current values of drain-to-source currents Ids in pixels of different mobilities μ are uniformized. As a result, variations in mobility μ in each pixel can be corrected. That is, the process of applying a negative feedback to the gate-to-source voltage Vgs of the driving transistor 22 by a feedback amount ΔV corresponding to the current (drain-to-source current Ids) flowing through the driving transistor 22 is the mobility correcting process.

Relations between the signal voltage Vsig of the video signal and the drain-to-source current Ids of the driving transistor 22 according to whether threshold value correction and mobility correction are performed or not in the pixel (pixel circuit) 20 shown in FIG. 2 will be described in the following with reference to FIGS. 8A, 8B, and 8C.

FIG. 8A represents a case where neither threshold value correction nor mobility correction is performed; FIG. 8B represents a case where mobility correction is not performed and only threshold value correction is performed; and FIG. 8C represents a case where threshold value correction and mobility correction are both performed. As shown in FIG. 8A, when neither threshold value correction nor mobility correction is performed, variations in threshold voltage Vth and mobility μ in the pixels A and B cause a large difference in drain-to-source current Ids between the pixels A and B.

On the other hand, when only threshold value correction is performed, as shown in FIG. 8B, variations in drain-to-source current Ids can be reduced to some extent, but a difference in drain-to-source current Ids between the pixels A and B due to variations in mobility a in the pixels A and B remains. By performing both threshold value correction and mobility correction, as shown in FIG. 8C, a difference in drain-to-source current Ids between the pixels A and B due to variations in threshold voltage Vth and mobility μ in the pixels A and B can be substantially eliminated. Thus, no variations in luminance of the organic EL element 21 occur at any gradation, so that a display image of excellent quality can be obtained.

In addition, the pixel 20 shown in FIG. 2 can provide the following action and effect by having the function of bootstrap operation by the storage capacitor 24 as described above in addition to the respective correcting functions of threshold value correction and mobility correction.

Even when the source potential Vs of the driving transistor 22 is changed with a secular change in I-V characteristic of the organic EL element 21, the gate-to-source voltage Vgs of the driving transistor 22 can be held constant by the bootstrap operation of the storage capacitor 24. Therefore the current flowing through the organic EL element 21 is unchanged and constant. As a result, the light emission luminance of the organic EL element 21 is also held constant. Thus, even when a secular change in I-V characteristic of the organic EL element 21 occurs, image display without luminance degradation attendant on the secular change in I-V characteristic of the organic EL element 21 can be achieved.

(Basic Sectional Structure of Pixel)

Figure 9:
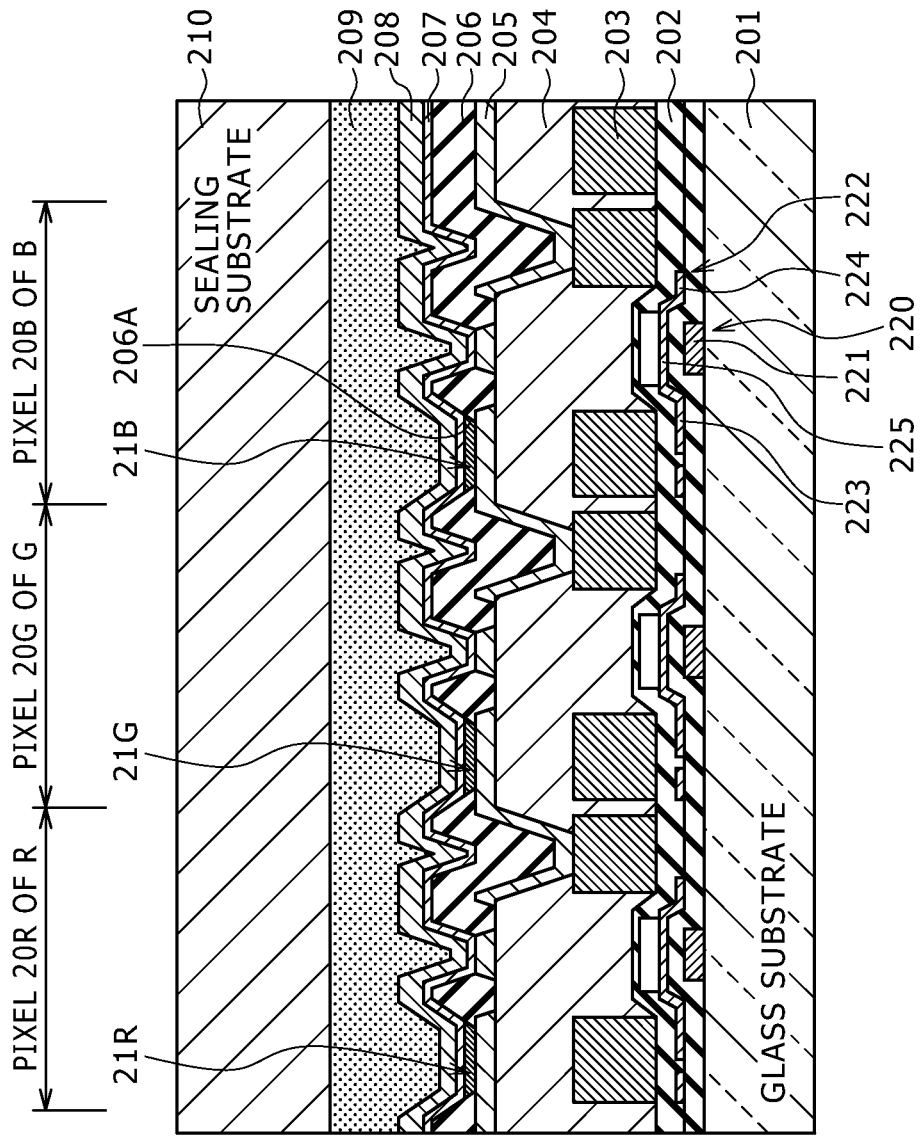
FIG. 9 is a sectional view of a basic sectional structure of a pixel.

A basic sectional structure of the pixel (sub-pixel) 20 will be described in the following. FIG. 9 is a sectional view of a basic sectional structure of the pixel 20.

As shown in FIG. 9, a driving circuit including a pixel transistor 220 such as the driving transistor 22 or the like is formed on a glass substrate 201. In this case, of constituent elements of the driving circuit, only the driving transistor 22 is shown in the figure, and the other constituent elements are omitted. Various pieces of wiring 203 are formed on the glass substrate 201 on which the driving circuit is formed, with an insulating film 202 interposed between the glass substrate 201 and the wiring 203, and a planarizing film (resin film) 204 is formed on the wiring 203. An anode electrode 205 made of a metal or the like is formed on the planarizing film 204. The anode electrode 205 is brought into contact with predetermined pieces of wiring 203.

A window insulating film 206 is formed on the anode electrode 205. Organic EL elements 21R, 21G, and 21B of RGB are provided in concave parts 206A of the window insulating film 206. Thereby, the openings of the concave parts 206A where the organic EL elements 21R, 21G, and 21B are provided become windows, and light of each color is emitted through the windows. That is, the windows of the window insulating film 206 can also be said to be the light emitting parts of the organic EL elements 21R, 21G, and 21B. A cathode electrode 207 made of a transparent conductive film or the like is formed on the window insulating film 206 as an electrode common to all pixels.

Though details of the organic EL elements 21R, 21G, and 21B are not shown in FIG. 9, the organic EL elements 21R, 21G, and 21B are of a structure having an organic layer interposed between the anode electrode 205 and the cathode electrode 207. The organic layer is formed by sequentially depositing a hole transporting layer/hole injection layer, a light emitting layer, an electron transporting layer, and an electron injection layer on the anode electrode 205. Under the current driving of the driving transistor 22 in FIG. 2, a current flows from the driving transistor 22 through the anode electrode 205 to the organic layer, so that light is emitted at a time of recombination of electrons and holes in the light emitting layer within the organic layer.

The driving transistor 220 is composed of a gate electrode 221, source/drain regions 223 and 224 provided on both end parts of a semiconductor layer 222, and a channel forming region 225 as a part opposed to the gate electrode 221 of the semiconductor layer 222. The source/drain region 223 is electrically connected to the anode electrode 205 of the organic EL element 21 via a contact hole.

After the organic EL elements 21R, 21G, and 21B are formed in a pixel unit on the glass substrate 201 via the insulating film 202, the planarizing film 204, and the window insulating film 206, a sealing substrate 210 is bonded by an adhesive 209 via an inorganic sealing film 208 of SiN or the like. The display panel 70 is formed by sealing the organic EL elements 21R, 21G, and 21B by the sealing substrate 210.

Figure 10:
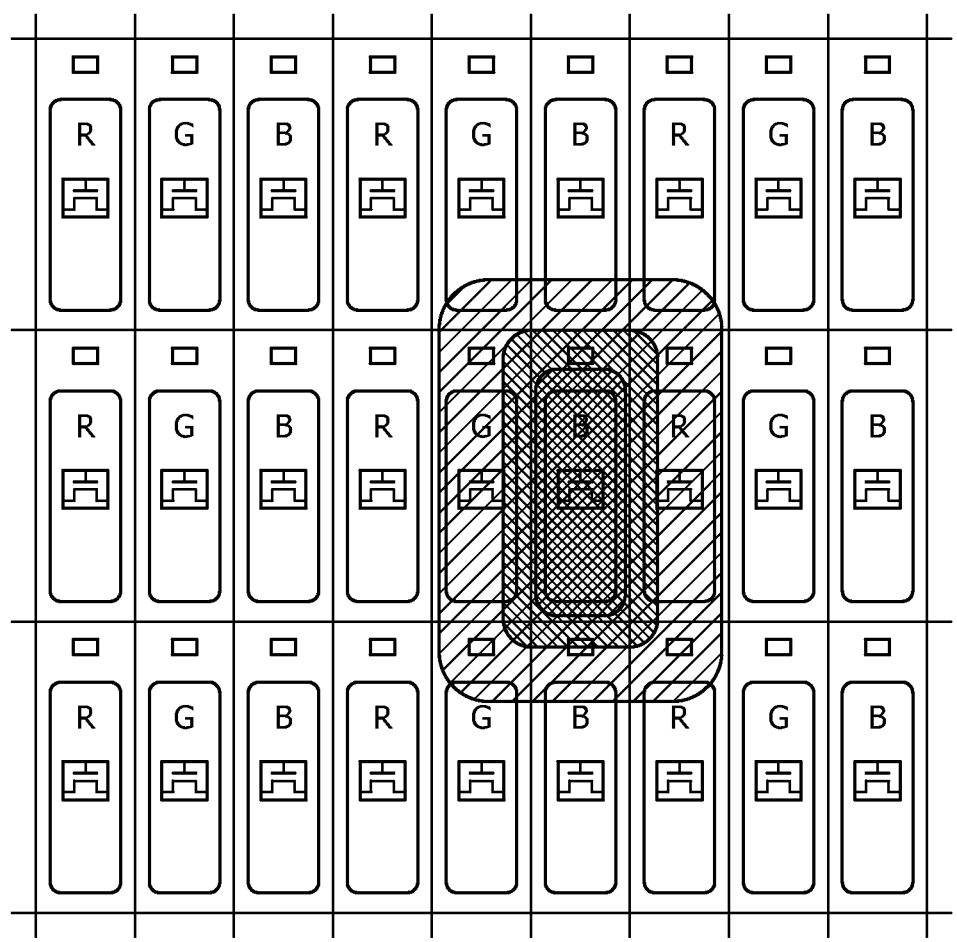
FIG. 10 is a diagram showing a state in which a part of light emitted by an organic EL element of a certain color affects adjacent pixel transistors of other colors.

As described above, in a device structure of the pixel 20 formed via the planarizing film 204 on the glass substrate 201 on which the pixel circuit including the pixel transistor 220 is formed, three pixels (sub-pixels) 20R, 20G, and 20B of RGB as a unit are disposed so as to be adjacent to each other. When the organic EL elements are a surface light source, for example, light emitted from an organic EL element of a certain color irradiates the periphery with a uniform distribution, as shown in FIG. 10. As a result, a part (leakage light) of the light emitted by the organic EL element of the certain color irradiates adjacent pixel transistors of other colors. At this time, blue light having a highest energy, in particular, has a strong effect on the pixel transistors of R and G.

Figure 21:
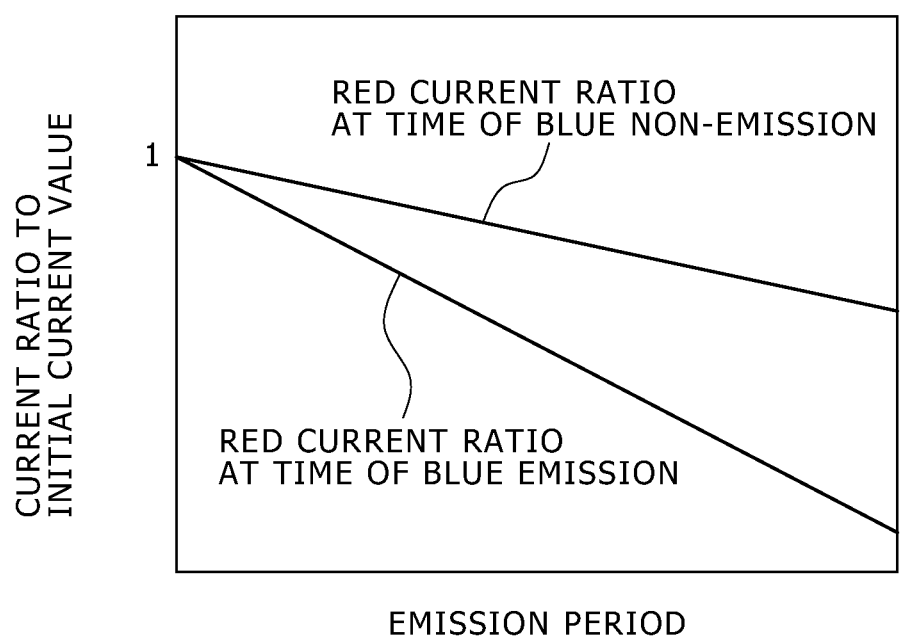
FIG. 21 is a diagram showing a current ratio to an initial current value with respect to the emission period of an organic EL element for red light.

As is clear from FIG. 10, also in the pixel of B, light emitted by the organic EL element 21B of the pixel of B itself irradiates the pixel transistor in the pixel of B. As described earlier, when the pixel transistors of RGB are irradiated with a part of blue light emitted by the organic EL element 21B of B, the characteristics of the pixel transistors change more greatly than when the pixel transistors are not irradiated (see FIG. 21). When changes in characteristics of the pixel transistors vary from color to color, a current ratio to an initial current value with respect to light emission time varies from color to color. Therefore a white balance is disturbed depending on an image being displayed.

[Characteristic Parts of Present Embodiment]

Accordingly, the present embodiment employs a structure in which relative positional relation between the pixel transistors of the pixels (sub-pixels) 20R, 20G, and 20B of respective light emission colors including blue light and the light emitting section of the organic EL element 21B emitting the blue light is laid out such that distances between the pixel transistors of the pixels (sub-pixels) 20R, 20G, and 20B and the light emitting section of the organic EL element 21B are equal to each other for the respective colors. The light emitting section of the organic EL element 21 refers to a part where light is emitted through a window of the window insulating film 206 described earlier. Concrete embodiments of the layout structure will be described in the following.

(First Embodiment)

Figure 11:
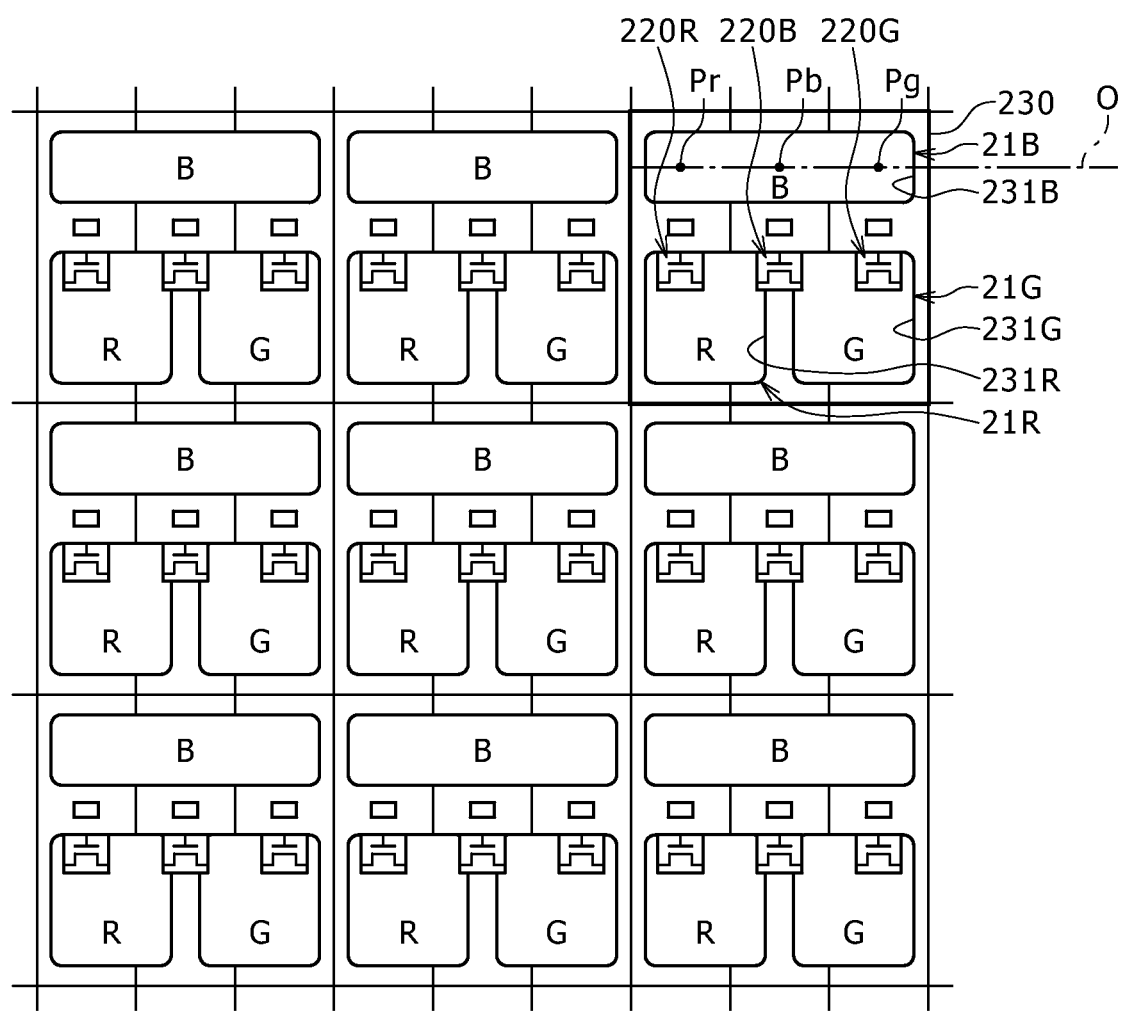
FIG. 11 is a plan view conceptually showing a layout structure according to a first embodiment.

FIG. 11 is a plan view conceptually showing a layout structure according to a first embodiment. As shown in FIG. 11, the organic EL elements 21R, 21G, and 21B of RGB are arranged so as to be adjacent to each other within a pixel forming region 230 of a square shape, for example, as a region for forming one pixel.

Specifically, the respective windows (light emitting sections) 231R and 231G of the organic EL elements 21R and 21G of RG are formed side by side in a shape close to a square on one side (lower side in the present example) in a column direction (direction of arrangement of pixels of a pixel row) of the pixel forming region 230. In addition, the window 231B of the organic EL element 21B of B is formed in a rectangular shape over the widths of the windows 231R and 231G on another side (upper side in the present example) in the column direction of the pixel forming region 230.

In addition, within the pixel forming region 230, the respective pixel transistors (for example the driving transistor 22 in FIG. 2) 220R, 220G, and 220B of the pixels 20R, 20G, and 20B of RGB are laid out at positions separated at a fixed distance from the window 231B of the organic EL element 21B along a direction of length of the window 231B. Suppose in this case that the organic EL element 21B emitting blue light is a surface light source. When the organic EL element 21B of B is a surface light source, light emission points of the organic EL element 21B with respect to the pixel transistors 220R, 220G, and 220B can be considered to be three points Pr, Pg, and Pb at a shortest distance from the pixel transistors and on a center line O of the window 231B.

As a result, when the organic EL element 21B of B is a surface light source, distances between the pixel transistors 220R, 220G, and 220B and the light emission points Pr, Pg, and Pb of the organic EL element 21B of B are equal to each other for the respective colors. Incidentally, suppose that being equal in the above expression includes some error and some difference in distance due to fine adjustment. With such a layout structure, a part of blue light emitted by the organic EL element 21B of B equally irradiates the pixel transistors 220R, 220G, and 220B.

Thereby, when irradiated with leakage light from the pixel 20B of B, the pixel transistors 220R, 220G, and 220B uniformly vary the transistor characteristics thereof, so that variations in characteristic changes from color to color can be reduced. As a result, a white balance can be maintained without depending on an image being displayed, so that a display image of excellent display quality can be obtained.

(Second Embodiment)

Figure 12:
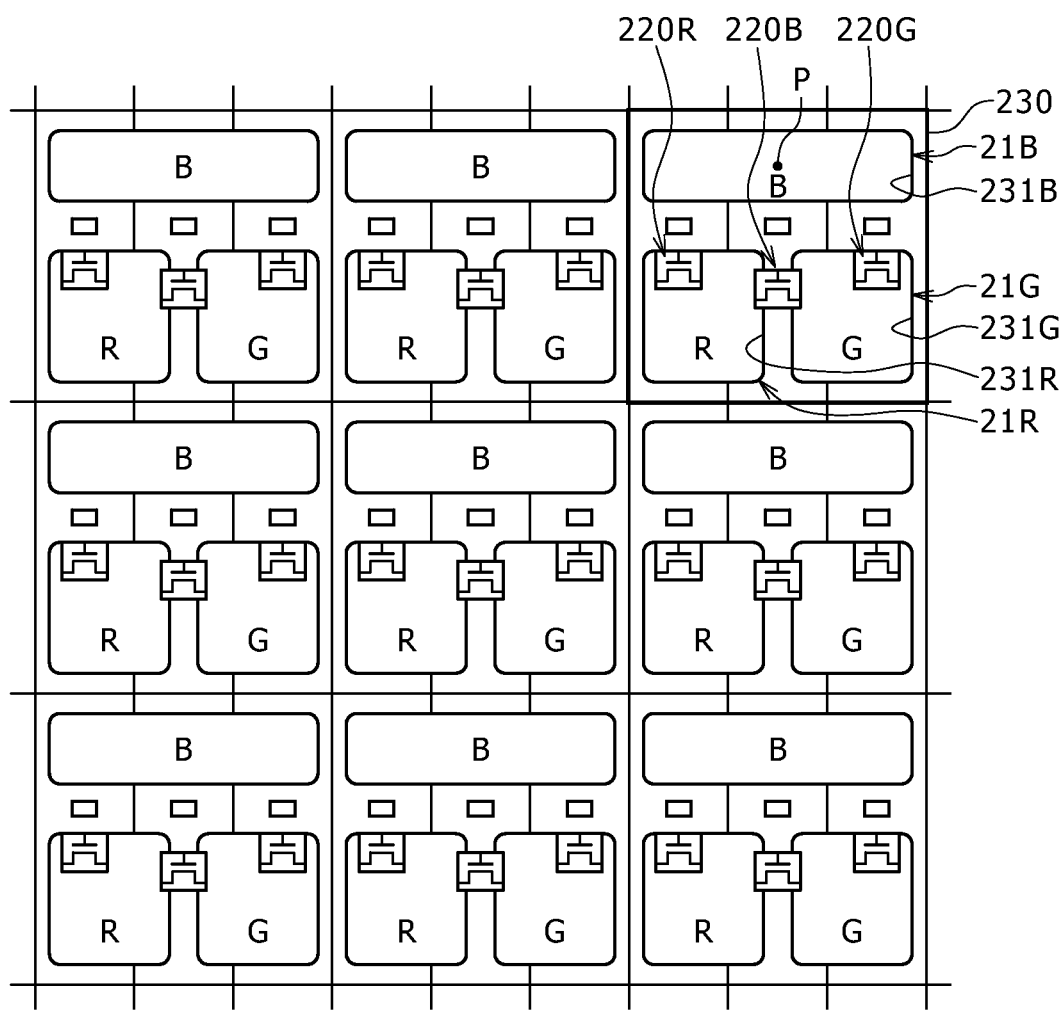
FIG. 12 is a plan view conceptually showing a layout structure according to a second embodiment.

FIG. 12 is a plan view conceptually showing a layout structure according to a second embodiment. In FIG. 12, same parts as in FIG. 11 are identified by the same reference numerals. As is clear from FIG. 12, the shapes and arrangement relation of the respective windows (light emitting sections) 231R, 231G, and 231B of organic EL elements 21R, 21G, and 21B are the same as in the first embodiment.

On the other hand, whereas a surface light source is used as the organic EL element 21B emitting blue light in the first embodiment, a point light source is used as the organic EL element 21B in the present second embodiment. Because the organic EL element 21B is a point light source, the light emission point P of the organic EL element 21B can be considered to be the center of the window 231B of the organic EL element 21B.

When the light emission point P of the organic EL element 21B is the center of the window 231B, in the layout of the pixel transistors 220R, 220G, and 220B in the first embodiment, the position of the pixel transistor 220B is at a shortest distance from the light emission point P. Accordingly, in the second embodiment, the pixel transistor 220B is disposed at a position separated from the window 231B as compared with the other pixel transistors 220R and 220G so that distances of the pixel transistors 220R, 220G, and 220B from the light emission point P are equal to each other for the respective colors.

Thus, when the organic EL element 21B is a point light source, the pixel transistors 220R, 220G, and 220B are arranged such that distances of the pixel transistors 220R, 220G, and 220B from the light emission point P of the organic EL element 21B are equal to each other for the respective colors. Thereby similar action and effects to those of the first embodiment can be obtained. That is, a part of blue light emitted by the organic EL element 21B of B equally irradiates the pixel transistors 220R, 220G, and 220B, and thus the characteristics of the pixel transistors 220R, 220G, and 220B vary uniformly. Therefore variations in characteristic changes from color to color can be reduced. As a result, a white balance can be maintained without depending on an image being displayed, so that a display image of excellent display quality can be obtained.

(Third Embodiment)

Figure 13:
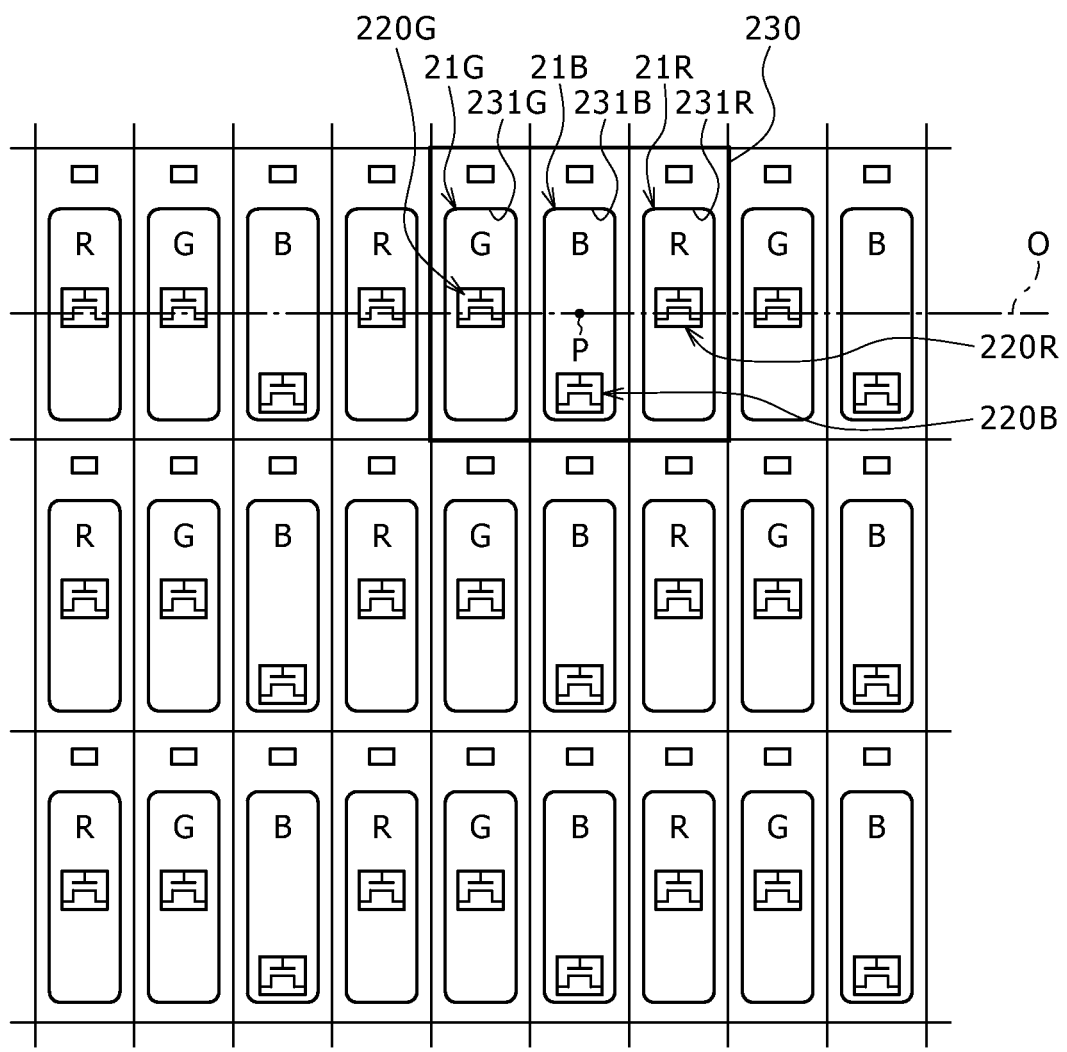
FIG. 13 is a plan view conceptually showing a layout structure according to a third embodiment.

FIG. 13 is a plan view conceptually showing a layout structure according to a third embodiment. In FIG. 13, same parts as in FIG. 11 are identified by the same reference numerals.

In the present third embodiment, in a pixel arrangement of pixels (sub-pixels) 20R, 20G, and 20B of RGB repetitively arranged along a row direction (direction of arrangement of pixels of a pixel row), three pixels 20G, 20B, and 20R with the pixel 20B in the middle form a unit of one pixel. The organic EL element 21B may be a surface light source or a point light source.

Description in the following will be made of a case where a point light source is used as the organic EL element 21B. When the organic EL element 21B is a point light source, the light emission point P of the organic EL element 21B can be considered to be the center of the window 231B of the organic EL element 21B. Blue light emitted from the light emission point P of the organic EL element 21B can be considered to irradiate the periphery with a uniform distribution having the light emission point P as a center.

Suppose in this case that the respective pixel transistors 220G and 220R of the pixels 20G and 20R of G and R are arranged on a center line O passing through the light emission point P, for example. At this time, the pixel transistor 220B of the pixel 20B of B is disposed at a position distant from the center line O so that distances of the pixel transistors 220R, 220G, and 220B from the light emission point P are equal to each other for the respective colors.

Similar action and effects to those of the first embodiment can be obtained by arranging the pixel transistors 220R, 220G, and 220B such that the distances of the pixel transistors 220R, 220G, and 220B from the light emission point P of the organic EL element 21B are equal to each other for the respective colors. That is, a part of blue light emitted by the organic EL element 21B of B equally irradiates the pixel transistors 220R, 220G, and 220B, and thus variations in characteristic changes of the pixel transistors 220R, 220G, and 220B from color to color can be reduced. As a result, a white balance can be maintained without depending on an image being displayed, so that a display image of excellent display quality can be obtained.

Incidentally, while the present third embodiment has been described assuming that a point light source is used as the organic EL element 21B, the third embodiment is also applicable to a case where a surface light source is used as the organic EL element 21B. In short, it suffices for the light emitting section of the organic EL element 21B and the pixel transistors 220R, 220G, and 220B to be in a layout relation such that a part of blue light emitted by the organic EL element 21B of B equally irradiates the pixel transistors 220R, 220G, and 220B.

(Fourth Embodiment)

Figure 14:
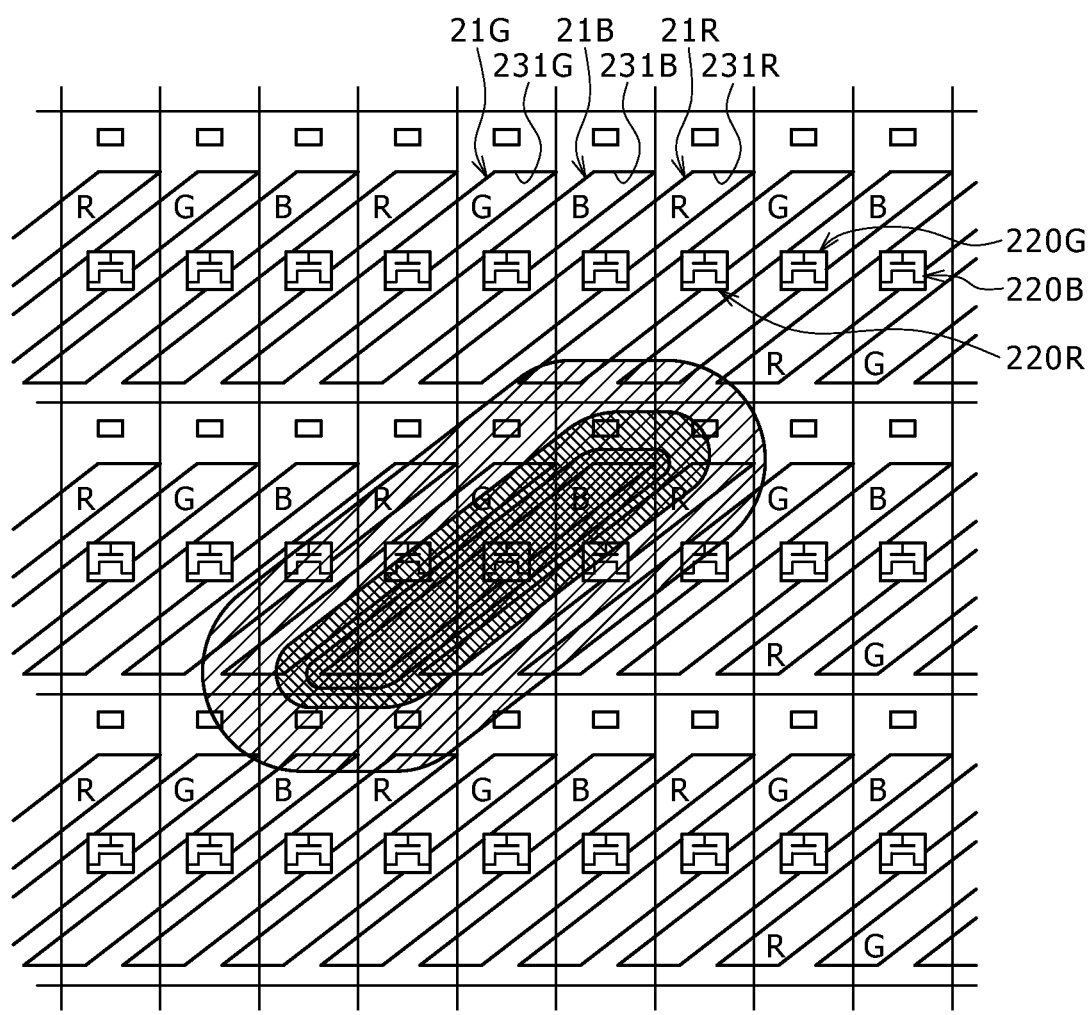
FIG. 14 is a plan view conceptually showing a layout structure according to a fourth embodiment.

FIG. 14 is a plan view conceptually showing a layout structure according to a fourth embodiment. In FIG. 14, same parts as in FIG. 11 are identified by the same reference numerals.

In the present fourth embodiment, in a pixel arrangement of pixels 20R, 20G, and 20B of RGB repetitively arranged along a row direction, light emitting sections, that is, windows 231R, 231G, and 231B of organic EL elements 21R, 21G, and 21B are formed obliquely. That is, the windows 231R, 231G, and 231B are formed in a state of being inclined at a predetermined angle to a column direction (direction of arrangement of pixels of a pixel column). On the other hand, the respective pixel transistors 220R, 220G, and 220B of the pixels 20R, 20G, and 20B are arranged on a center line O passing through the centers of the windows 231R, 231G, and 231B, for example.

Suppose that for example a surface light source is used as the organic EL element 21B of B. When the organic EL element 21B is a surface light source, as shown in FIG. 14, blue light emitted from the organic EL element 21B irradiates the periphery of the window 231G with a uniform distribution from the window 231G. At this time, because the windows 231R, 231G, and 231B are inclined, an amount of irradiation of the adjacent pixels 20R and 20G with the blue light emitted by the organic EL element 21B of B increases. Thereby the amounts of irradiation of the pixel transistors 220R and 220G of the adjacent pixels 20R and 20G with the blue light can be made closer to an amount of irradiation of the pixel transistor 220B of the pixel 20B.

By thus making the amounts of irradiation of the pixel transistors 220R, 220G, and 220B with a part of the blue light emitted by the organic EL element 21B of B close to each other, variations in characteristic changes from color to color can be reduced. As a result, a white balance can be maintained without depending on an image being displayed, so that a display image of excellent display quality can be obtained.

Incidentally, while in the fourth embodiment, the respective pixel transistors 220R, 220G, and 220B of the pixels 20R, 20G, and 20B are arranged on the center line O passing through the centers of the windows 231R, 231G, and 231B, the embodiments of the present invention is not limited to this layout. For example, with respect to the irradiation distribution of the blue light shown in FIG. 14, the pixel transistor 220G is shifted in a downward direction of the figure, and the pixel transistor 220R is shifted in an upward direction of the figure. Thus, the amounts of irradiation of the pixel transistors 220R and 220G of the adjacent pixels 20R and 20G with the blue light can be made even closer to the amount of irradiation of the pixel transistor 220B of the pixel 20B.

[Examples of Modification]

While the foregoing embodiments have been described by taking as an example a case where the driving circuit of the organic EL element 21 has a 2Tr circuit configuration composed of two transistors, which are the driving transistor 22 and the writing transistor 23, as a basic configuration, as shown in FIG. 2, the present invention is not limited to application to this circuit configuration.

Figure 15:
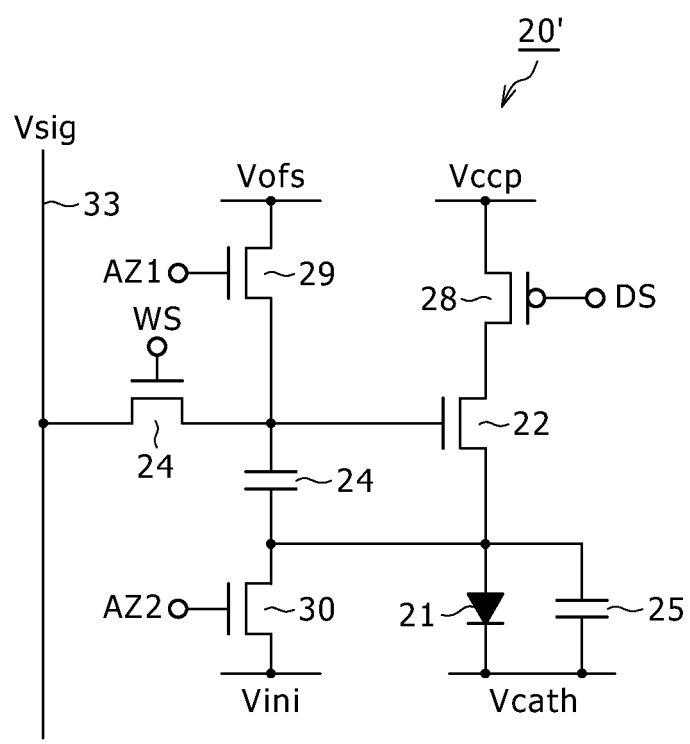
FIG. 15 is a circuit diagram showing an example of circuit configuration of a pixel having another configuration.

As an example, as shown in FIG. 15, a pixel 20' is known which pixel has, as a basic configuration, a 5Tr circuit configuration composed of five transistors, which are a light emission controlling transistor 28 and two switching transistors 29 and 30 in addition to a driving transistor 22 and a writing transistor 23 (see Japanese Patent Laid-Open No. 2005-345722). In this case, a Pch transistor is used as the light emission controlling transistor 28, and an Nch transistor is used as the switching transistors 29 and 30. However, the combination of the conduction types of these transistors is arbitrary.

The light emission controlling transistor 28 is connected in series with the driving transistor 22. The light emission controlling transistor 28 selectively supplies a high potential Vccp to the driving transistor 22, thereby controlling emission/non-emission of an organic EL element 21. The switching transistor 29 selectively supplies a reference potential Vofs to the gate electrode of the driving transistor 22, thereby initializing the gate potential Vg of the driving transistor 22 to the reference potential Vofs. The switching transistor 30 selectively supplies a low potential Vini to the source electrode of the driving transistor 22, thereby initializing the source potential Vs of the driving transistor 22 to the low potential Vini.

While the 5Tr circuit configuration has been taken above as an example of another pixel configuration, various pixel configurations are conceivable, including for example a configuration in which the switching transistor 29 is omitted by supplying the reference potential Vofs through a signal line 33 and writing the reference potential Vofs by the writing transistor 23.

In addition, while the foregoing embodiments have been described by taking as an example a case where the present invention is applied to an organic EL display device using an organic EL element as an electrooptic element of the pixel 20, the present invention is not limited to this application example. Specifically, the present invention is applicable to display devices in general using a current-driven type electrooptic element (light emitting element) whose light emission luminance changes according to the value of a current flowing through the device, such as an inorganic EL element, a LED element, a semiconductor laser element or the like.

[Examples of Application]

A display device according to an embodiment of the present invention is applicable to display devices of electronic devices in all fields that display a video signal input thereto or a video signal generated therein as an image or video. For example, a display device according to an embodiment of the present invention is applicable to display devices of various electronic devices shown in FIGS. 16 to 20G, such for example as digital cameras, notebook personal computers, portable terminal devices such as portable telephones and the like, and video cameras.

By thus using a display device according to an embodiment of the present invention as display devices of electronic devices in all fields, high-quality image display can be made in various electronic devices. Specifically, as is clear from the description of the foregoing embodiments, a display device according to an embodiment of the present invention can provide a high-quality display image because the display device can reduce variations in characteristic changes of the pixel transistors from color to color, and maintain a white balance without depending on the display image.

A display device according to an embodiment of the present invention includes a display device in the form of a sealed module. For example, a display module formed by attaching a counter part such as a transparent glass or the like to a pixel array section corresponds to a display device in the form of a sealed module. This transparent counter part may be provided with a color filter, a protective film or the like, and a light shielding film as described above. Incidentally, the display module may be provided with a circuit part, an FPC (Flexible Printed Circuit), or the like for externally inputting or outputting a signal and the like to the pixel array section.

Concrete examples of electronic devices to which the present invention is applied will be described in the following.

Figure 16:
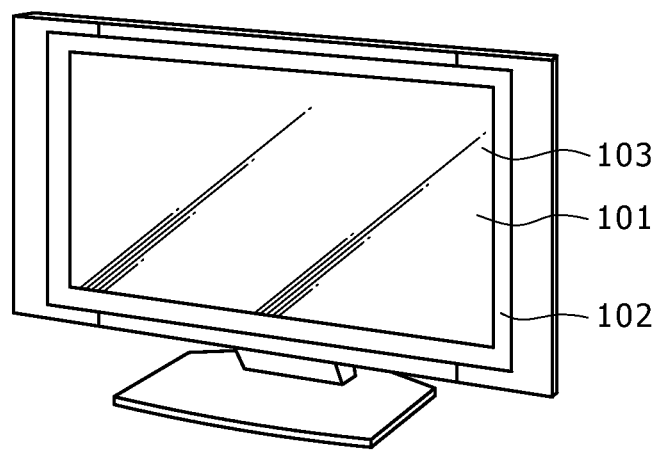
FIG. 16 is a perspective view of an external appearance of a television set to which the embodiments of the present invention is applied.

FIG. 16 is a perspective view of an external appearance of a television set to which the present invention is applied. The television set according to the present example of application includes a video display screen part 101 composed of a front panel 102, a filter glass 103 and the like, and is fabricated using a display device according to an embodiment of the present invention as the video display screen part 101.

Figure 17A:
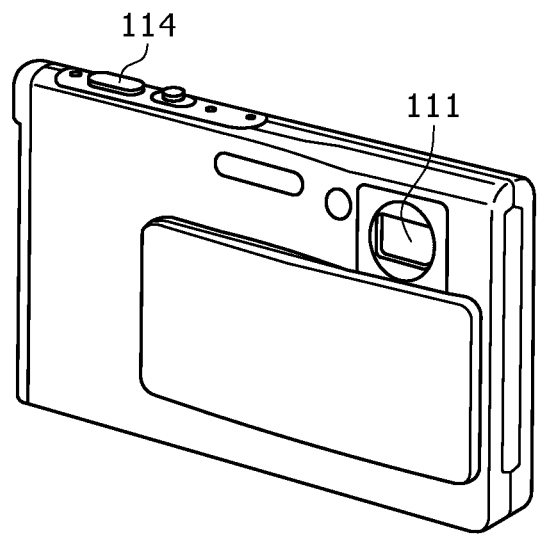
FIGS. 17A and 17B are perspective views of an external appearance of a digital camera to which the embodiments of the present invention is applied, FIG. 17A being a perspective view of the digital camera as viewed from a front side, and FIG. 17B being a perspective view of the digital camera as viewed from a back side.
Figure 17B:
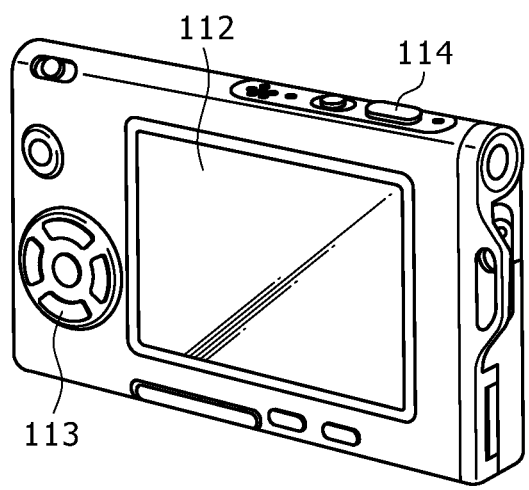

FIGS. 17A and 17B are perspective views of an external appearance of a digital camera to which the present invention is applied. FIG. 17A is a perspective view of the digital camera as viewed from a front side, and FIG. 17B is a perspective view of the digital camera as viewed from a back side. The digital camera according to the present example of application includes a light emitting part 111 for flashlight, a display part 112, a menu switch 113, a shutter button 114, and the like. The digital camera is fabricated using a display device according to an embodiment of the present invention as the display part 112.

Figure 18:
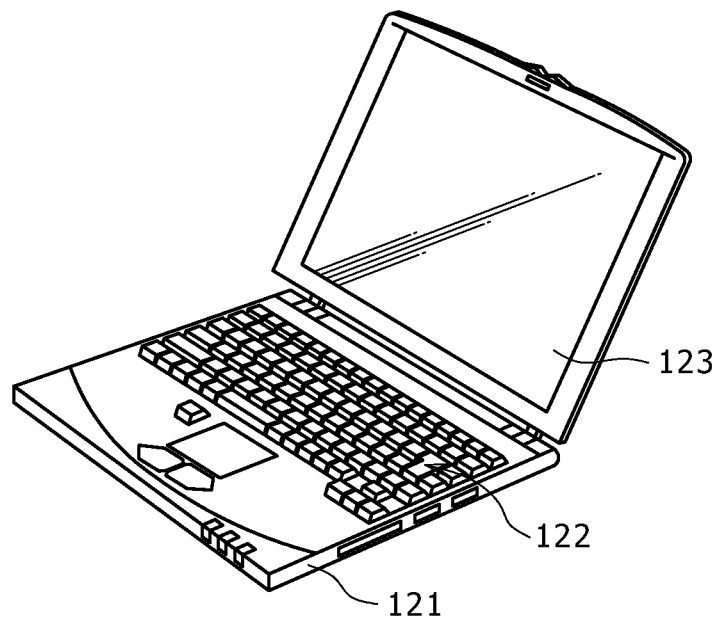
FIG. 18 is a perspective view of an external appearance of a notebook personal computer to which the embodiments of the present invention is applied.

FIG. 18 is a perspective view of an external appearance of a notebook personal computer to which the present invention is applied. The notebook personal computer according to the present example of application includes a keyboard 122 operated to input characters and the like, a display part 123 for displaying an image, and the like in a main unit 121. The notebook personal computer is fabricated using a display device according to an embodiment of the present invention as the display part 123.

Figure 19:
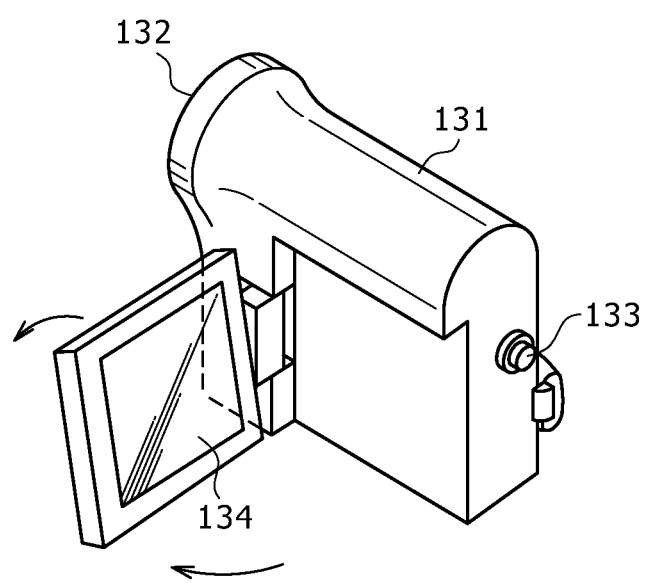
FIG. 19 is a perspective view of an external appearance of a video camera to which the embodiments of the present invention is applied.

FIG. 19 is a perspective view of an external appearance of a video camera to which the present invention is applied. The video camera according to the present example of application includes a main unit 131, a lens 132 for taking a subject in a side surface facing frontward, a start/stop switch 133 at a time of picture taking, a display part 134, and the like. The video camera is fabricated using a display device according to an embodiment of the present invention as the display part 134.

FIGS. 20A, 20B, 20C, 20D, 20E, 20F, and 20G are diagrams showing an external appearance of a portable terminal device, for example a portable telephone to which the present invention is applied. FIG. 20A is a front view of the portable telephone in an opened state, FIG. 20B is a side view of the portable telephone in the opened state, FIG. 20C is a front view of the portable telephone in a closed state, FIG. 20D is a left side view, FIG. 20E is a right side view, FIG. 20F is a top view, and FIG. 20G is a bottom view. The portable telephone according to the present example of application includes an upper side casing 141, a lower side casing 142, a coupling part (a hinge part in this case) 143, a display 144, a sub-display 145, a picture light 146, a camera 147, and the like. The portable telephone according to the present example of application is fabricated using a display device according to an embodiment of the present invention as the display 144 and the sub-display 145.

The present application contains subject matter related to that disclosed in Japanese Priority Patent Application JP 2008-132854 filed in the Japan Patent Office on May 21, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A pixel arrangement of an organic light emitting display device with a plurality of repeatedly arranged sub-pixel groups, each of the sub-pixel groups comprising:
   two first sub-pixels in i-th and (i+2)-th lines (i is a natural number);
   two second sub-pixels in (i+1)-th and (i+3)-th lines; and
   two third sub-pixels in the (i+1)-th and (i+3)-th lines,
   wherein the first sub-pixel in the (i+2)-th line is disposed between the second sub-pixel in the (i+1)-th line and the second sub-pixel in the (i+3)-th line,
   wherein the first sub-pixel in the (i+2)-th line is disposed between the third sub-pixel in the (i+1)-th line and the third sub-pixel in the (i+3)-th line,
   wherein the i-th and (i+2)-th line include only the first sub-pixels,
   wherein the first sub-pixel is at least two times longer than the second sub-pixel along a first direction, and
   wherein the second sub-pixels and the third sub-pixels are alternately arranged in a same line, the (i+1)-th and (i+3)-th line including only the first and second sub-pixels.

2. The pixel arrangement of the organic light emitting display device according to claim 1, wherein the second sub-pixel and the third sub-pixel are longer than the first sub-pixel along a second direction.

3. The pixel arrangement of the organic light emitting display device according to claim 1, wherein the first sub-pixel is a blue sub-pixel, the second sub-pixel is a red sub-pixel, and the third sub-pixel is a green sub-pixel.

4. An organic light emitting display device including a plurality of repeatedly arranged sub-pixel groups, each of the sub-pixel groups comprising:
   two first sub-pixels in i-th and (i+2)-th lines (i is a natural number);
   two second sub-pixels in (i+1)-th and (i+3)-th lines; and
   two third sub-pixels in the (i+1)-th and (i+3)-th lines,
   wherein the first sub-pixel in the (i+2)-th line is disposed between the second sub-pixel in the (i+1)-th line and the second sub-pixel in the (i+3)-th line,
   wherein the first sub-pixel in the (i+2)-th line is disposed between the third sub-pixels in (i+1)-th line and the third sub-pixel in the (i+3)-th line,
   wherein the i-th and (i+2)-th line include only the first sub-pixels,
   wherein the first sub-pixel is at least two times longer than the second sub-pixel along a first direction, and
   wherein the second sub-pixels and the third sub-pixels are alternately arranged in a same line, the (i+1)-th and (i+3)-th line including only the first and second sub-pixels.

5. The organic light emitting display device according to claim 4, wherein the second sub-pixel and the third sub-pixel are longer than the first sub-pixel along a second direction.

6. The organic light emitting display device according to claim 4, wherein the first sub-pixel is a blue sub-pixel, the second sub-pixel is a red sub-pixel, and the third sub-pixel is a green sub-pixel.

7. An organic light emitting display device including a plurality of light emitting region groups, each of the light emitting region groups comprising:
   two first light emitting regions in i-th and (i+2)-th lines (i is a natural number);

two second light emitting regions in (i+1)-th and (i+3)-th lines; and two third light emitting regions in the (i+1)-th and (i+3)-th lines, wherein the first light emitting region in the (i+2)-th line is disposed between the second light emitting region in the (i+1)-th line and the second light emitting region in the (i+3)-th line, wherein the first light emitting region in the (i+2)-th line is disposed between the third light emitting region in the (i+1)-th line and the third light emitting region in the (i+3)-th line, wherein the i-th and (i+2)-th line include only the first light emitting regions, wherein the first light emitting region is at least two times longer than the second light emitting region along a first direction, and wherein the second light emitting region and the third light emitting region are alternately arranged in a same line, the (i+1)-th and (i+3)-th line including only the first and second light emitting regions.

8. The organic light emitting display device according to claim 7, wherein the second light emitting region and the third light emitting region are longer than the first light emitting region along a second direction.

9. The organic light emitting display device according to claim 7, wherein the first light emitting region is configured to emit blue light, the second light emitting region is configured to emit red light, and the third light emitting region is configured to emit green light.

10. An organic light emitting display device including a plurality of sub-pixel circuits and a plurality of light emitting region groups, each of the light emitting region groups comprising:

two first light emitting regions in i-th and (i+2)-th lines (i is a natural number);

two second light emitting regions in (i+1)-th and (i+3)-th lines; and two third light emitting regions in the (i+1)-th and (i+3)-th lines, wherein the plurality of sub-pixel circuits comprises first sub-pixel circuits connected to the first light emitting regions, second sub-pixel circuits connected to the second light emitting regions, and third sub-pixel circuits connected to the third light emitting regions, wherein the first light emitting region in the (i+2)-th line is disposed between the second light emitting region in the (i+1)-th line and the second light emitting region in the (i+3)-th line, wherein the first light emitting region in the (i+2)-th line is disposed between the third light emitting region in the (i+1)-th line and the third light emitting region in the (i+3)-th line, wherein the i-th and (i+2)-th line include only the first light emitting regions, wherein the first light emitting region is at least two times longer than the second light emitting region along a first direction, and wherein the second light emitting region and the third light emitting region are alternately arranged in a same line, the (i+1)-th and (i+3)-th line including only the first and second light emitting regions.

11. The organic light emitting display device according to claim 10, wherein each of the first sub-pixel circuits, the second sub-pixel circuits, and the third sub-pixel circuits include:

a first transistor;
a second transistor; and
a capacitor, wherein the capacitor is configured to store a potential according to a video signal supplied from a video signal line via the second transistor, and wherein the first transistor is configured to flow a drive current according to the potential.

12. The organic light emitting display device according to claim 11, wherein the second light emitting region and the third light emitting region are longer than the first light emitting region along the second direction.

13. The organic light emitting display device according to claim 12, wherein the first light emitting region is configured to emit blue light, the second light emitting region is configured to emit red light, and the third light emitting region is configured to emit green light.

14. An organic light emitting display device including a plurality of repeatedly arranged sub-pixel groups, each of the sub-pixel groups comprising:

two first sub-pixels in i-th and (i+2)-th lines (i is a natural number);

two second sub-pixels in (i+1)-th and (i+3)-th lines; and two third sub-pixels in the (i+1)-th and (i+3)-th lines, wherein the i-th and (i+2)-th line include only the first sub-pixels, wherein the (i+1)-th and (i+3)-th lines include only the second sub-pixels and third sub-pixels, wherein the first sub-pixel is at least two times longer than each of the second sub-pixel and the third sub-pixel along a first direction, wherein the first sub-pixel is narrower than each of the second sub-pixel and the third sub-pixel along a second direction perpendicular to the first direction, and wherein the second sub-pixels and the third sub-pixels are alternately arranged in a same line.

15. The organic light emitting display device according to claim 14, wherein the first sub-pixel is a blue sub-pixel, the second sub-pixel is a red sub-pixel, and the third sub-pixel is a green sub-pixel.

16. An organic light emitting display device including a plurality of light emitting region groups, each of the light emitting region groups comprising:

two first light emitting regions in i-th and (i+2)-th lines (i is a natural number);

two second light emitting regions in (i+1)-th and (i+3)-th lines; and two third light emitting regions in the (i+1)-th and (i+3)-th lines, wherein the i-th and (i+2)-th line include only the first light emitting regions, wherein the (i+1)-th and (i+3)-th line including only the second light emitting regions and third light emitting regions, wherein the first light emitting region is at least two times longer than the second light emitting region and the third light emitting region along a first direction, wherein the first light emitting region is narrower than the second light emitting region and the third light emitting region along a second direction perpendicular to the first direction, and wherein the second light emitting regions and the third light emitting regions are alternately arranged in a same line.

17. The organic light emitting display device according to claim 16, wherein the first light emitting region is configured to emit blue light, the second light emitting region is configured to emit red light, and the third light emitting region is configured to emit green light.

18. An organic light emitting display device including a plurality of sub-pixel circuits and a plurality of light emitting region groups, each of the light emitting region groups comprising:
    two first light emitting regions in i-th and (i+2)-th lines (i is a natural number);
    two second light emitting regions in (i+1)-th and (i+3)-th lines; and
    two third light emitting regions in the (i+1)-th and (i+3)-th lines,
    wherein the plurality of sub-pixel circuits comprises first sub-pixel circuits connected to the first light emitting regions, second sub-pixel circuits connected to the second light emitting regions, and third sub-pixel circuits connected to the third light emitting regions,
    wherein the i-th and (i+2)-th line include only the first light emitting regions,
    wherein the (i+1)-th and (i+3)-th line including only the second light emitting regions and third light emitting regions,
    wherein the first light emitting region is at least two times longer than the second light emitting region and the third light emitting region along a first direction,
    wherein the first light emitting region is narrower than the second light emitting region and the third light emitting region along a second direction perpendicular to the first direction, and
    wherein the second light emitting regions and the third light emitting regions are alternately arranged in a same line.

19. The organic light emitting display device according to claim 18, wherein each of the first sub-pixel circuits, the second sub-pixel circuits, and the third sub-pixel circuits include:
    a first transistor;
    a second transistor; and
    a capacitor,
    wherein the capacitor is configured to store a potential according to a video signal supplied from a video signal line via the second transistor, and
    wherein the first transistor is configured to flow a drive current according to the potential.

20. The organic light emitting display device according to claim 19, wherein the first light emitting region is configured to emit blue light, the second light emitting region is configured to emit red light, and the third light emitting region is configured to emit green light.

21. An organic light emitting display device comprising:
    a light emitting region group including:
        a plurality of first light emitting regions;
        a plurality of second light emitting regions; and
        a plurality of third light emitting regions; and
    a sub-pixel circuit group including:
        a plurality of first sub-pixel circuits associated with the first light emitting regions;
        a plurality of second sub-pixel circuits associated with the second light emitting regions; and
        a plurality of third sub-pixel circuits associated with the third light emitting regions,
    wherein an i-th line of the light emitting region group includes only the first light emitting regions (i is a natural number),
    wherein an (i+1)-th line of the light emitting region group includes only the second light emitting regions and the third light emitting regions,
    wherein each of the first light emitting regions is at least two times longer than each of the second light emitting regions and the third light emitting regions along a first direction,
    wherein each of the first light emitting regions is narrower than each of the second light emitting regions and the third light emitting regions along a second direction perpendicular to the first direction,
    wherein the second light emitting regions and the third light emitting regions are alternately arranged in the (i+1)-th line, and
    wherein the first, second, and third sub-pixel circuits are arranged in a stripe arrangement.

22. The organic light emitting display device according to claim 21, wherein the first light emitting region is configured to emit blue light, the second light emitting region is configured to emit red light, and the third light emitting region is configured to emit green light.

23. The organic light emitting display device according to claim 22, wherein each of the first sub-pixel circuit, the second sub-pixel circuit, and the third sub-pixel circuit include:
    a first transistor;
    a second transistor; and
    a capacitor,
    wherein the capacitor is configured to store a potential according to a video signal supplied from a video signal line via the second transistor, and
    wherein the first transistor is configured to flow a drive current according to the potential.

* * * * *